US012568625B2

(12) United States Patent
Choi et al.

(10) Patent No.: US 12,568,625 B2
(45) Date of Patent: Mar. 3, 2026

(54) SEMICONDUCTOR DEVICE AND MANUFACTURING METHOD OF SEMICONDUCTOR DEVICE

(71) Applicant: SK hynix Inc., Icheon-si (KR)

(72) Inventors: Won Geun Choi, Icheon-si (KR); Rho Gyu Kwak, Icheon-si (KR); In Su Park, Icheon-si (KR); Jung Shik Jang, Icheon-si (KR); Jung Dal Choi, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 308 days.

(21) Appl. No.: 18/337,232

(22) Filed: Jun. 19, 2023

(65) Prior Publication Data

US 2024/0284671 A1     Aug. 22, 2024

(30) Foreign Application Priority Data

Feb. 20, 2023     (KR) ........................ 10-2023-0022279

(51) Int. Cl.
| | |
|---|---|
| *H10B 43/27* | (2023.01) |
| *H10B 41/10* | (2023.01) |
| *H10B 41/27* | (2023.01) |
| *H10B 41/30* | (2023.01) |
| *H10B 43/10* | (2023.01) |
| *H10B 43/30* | (2023.01) |

(52) U.S. Cl.
CPC ............. *H10B 43/27* (2023.02); *H10B 41/10* (2023.02); *H10B 41/27* (2023.02); *H10B 41/30* (2023.02); *H10B 43/10* (2023.02); *H10B 43/30* (2023.02)

(58) Field of Classification Search
CPC ........ H10B 43/27; H10B 41/30; H10B 41/10; H10B 43/30; H10B 43/10; H10B 41/27
See application file for complete search history.

(56) References Cited

U.S. PATENT DOCUMENTS

| | | | |
|---|---|---|---|
| 11,056,504 B2 | 7/2021 | Jiang et al. | |
| 2024/0196609 A1* | 6/2024 | Park ....................... | H10B 41/10 |
| 2024/0276722 A1* | 8/2024 | Choi ....................... | H10B 43/27 |

FOREIGN PATENT DOCUMENTS

KR     1020220000581 A     1/2022

* cited by examiner

*Primary Examiner* — Richard A Booth
(74) *Attorney, Agent, or Firm* — WILLIAM PARK AND ASSOCIATES LTD.

(57) ABSTRACT
A semiconductor device includes a gate structure including conductive layers and insulating layers that are alternately stacked. The semiconductor device also includes an insulating core located in the gate structure and including a long axis and a short axis. The semiconductor device further includes a first channel pattern and a second channel pattern surrounding the insulating core and located to face each other along the long axis. The semiconductor device additionally includes a barrier pattern surrounding the first channel pattern and the second channel pattern and having different thicknesses along the long axis and the short axis.

17 Claims, 37 Drawing Sheets

MP2

15  14

18  19  13B

12

LV1

11A_P
11A

LV2

GST

11

12

A-A'

III

II

A-A'

OP1

LV1

LV2

32

31

ST

31

32

B-B'

OP1

LV1

LV2

33

32

31

31

32

ST

B-B'

A-A'

OP1

33A

32

31

LV1

LV2

ST

31

32

B-B'

A-A'

B-B'

A-A'

B-B'

A-A'

B-B'

A-A'

B-B'

A-A'

B-B'

SEMICONDUCTOR DEVICE AND MANUFACTURING METHOD OF SEMICONDUCTOR DEVICE

CROSS-REFERENCE TO RELATED APPLICATION

This application claims priority under 35 U.S.C. § 119(a) to Korean Patent Application No. 10-2023-0022279 filed on Feb. 20, 2023, in the Korean Intellectual Property Office, which is incorporated herein by reference in its entirety.

BACKGROUND

1. Technical Field

Embodiments of the present disclosure relate to an electronic device, and more particularly, to a semiconductor device and a manufacturing method of the semiconductor device.

2. Related Art

The degree of integration of a semiconductor device is mainly determined by an area occupied by a unit memory cell. Recently, as the improvement in the degree of integration of a semiconductor device for forming memory cells in a single layer on a substrate reaches a limit, a three-dimensional semiconductor device for stacking memory cells on a substrate has been proposed. Furthermore, to improve the operational reliability of such a semiconductor device, various structures and manufacturing methods have been developed.

SUMMARY

In an embodiment, a semiconductor device may include: a gate structure including conductive layers and insulating layers that are alternately stacked; an insulating core located in the gate structure, the insulating core including a long axis and a short axis; a first channel pattern and a second channel pattern surrounding the insulating core and located to face each other along the long axis; and a barrier pattern surrounding the first channel pattern and the second channel pattern, the barrier pattern having different thicknesses at the long axis and the short axis.

In an embodiment, a semiconductor device may include: a gate structure including conductive layers and insulating layers that are alternately stacked; a first channel pattern and a second channel pattern located in the gate structure; an insulating core located between the first channel pattern and the second channel pattern; a memory pattern surrounding the first channel pattern, the second channel pattern, and the insulating core; and a barrier pattern surrounding the memory pattern, wherein each of the conductive layers may include a protrusion protruding toward the insulating core through the barrier pattern and the memory pattern.

In an embodiment, a manufacturing method of a semiconductor device may include: forming a stack including first material layers and second material layers that are alternately stacked; forming, in the stack, a first opening including a long axis and a short axis; forming, in the first opening, a barrier layer having different thicknesses at the long axis and the short axis; forming a channel layer in the barrier layer; forming a slit in the stack; forming second openings by etching the first material layers through the slit; forming a barrier pattern exposing the channel layer at the short axis by etching the barrier layer through the second opening; and forming a first channel pattern and a second channel pattern located to face each other along the long axis by etching the channel layer using the barrier pattern as an etching barrier.

In an embodiment, a manufacturing method of a semiconductor device may include: forming a stack including first material layers and second material layers that are alternately stacked; forming a barrier layer in the stack; forming a channel layer in the barrier layer; forming an insulating core in the channel layer; forming second openings exposing the barrier layer by etching the first material layers; and forming, in the second openings, third material layers each including a protrusion protruding toward the insulating core through the barrier layer and the channel layer.

DETAILED DESCRIPTION

Various embodiments are directed to a semiconductor device having a stable structure and improved characteristics and a manufacturing method of the semiconductor device.

By stacking memory cells in three dimensions, it is possible to improve the degree of integration of a semiconductor device. It is also possible to provide a semiconductor device having a stable structure and improved reliability.

Hereafter, embodiments in accordance with the technical spirit of the present disclosure will be described with reference to the accompanying drawings.

Figure 1A:
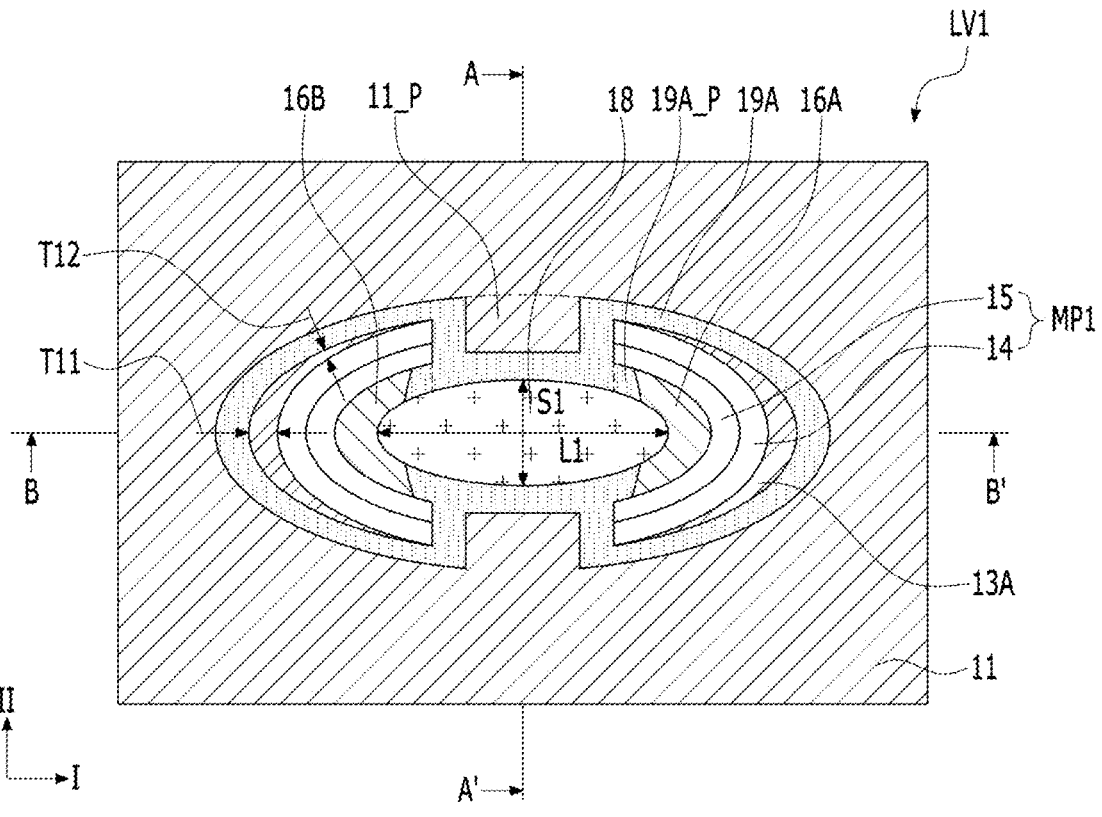
FIG. 1A to FIG. 1D are views illustrating the structure of a semiconductor device in accordance with an embodiment.
Figure 1B:
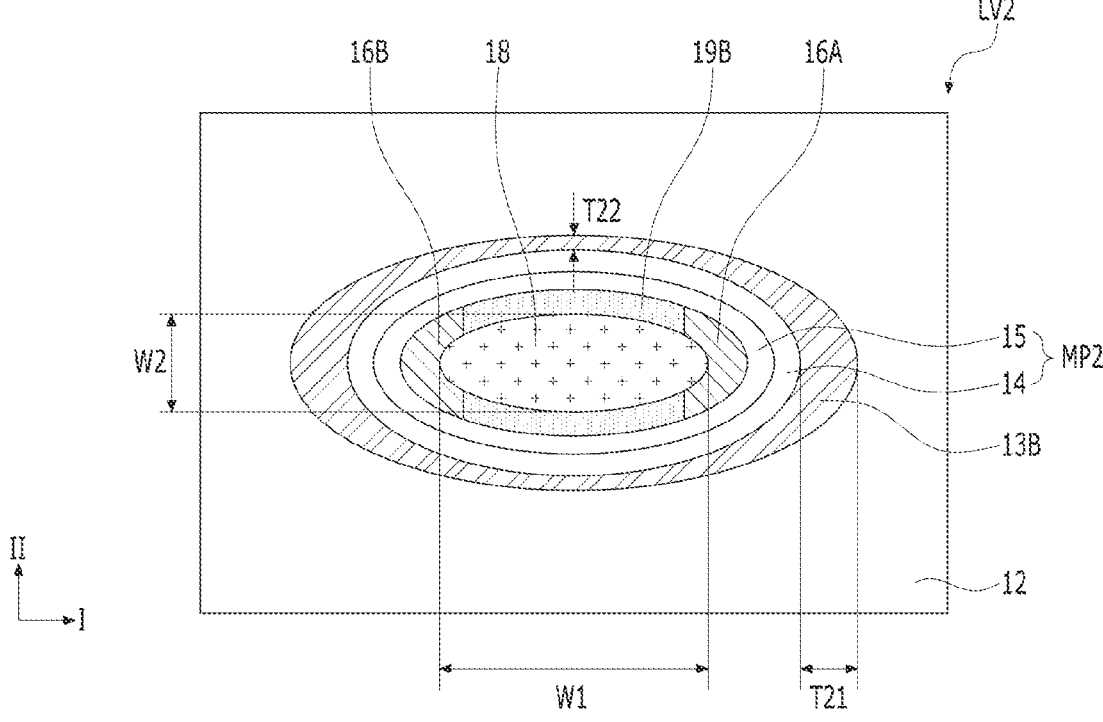
Figure 1C:
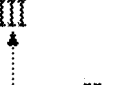
Figure 1D:
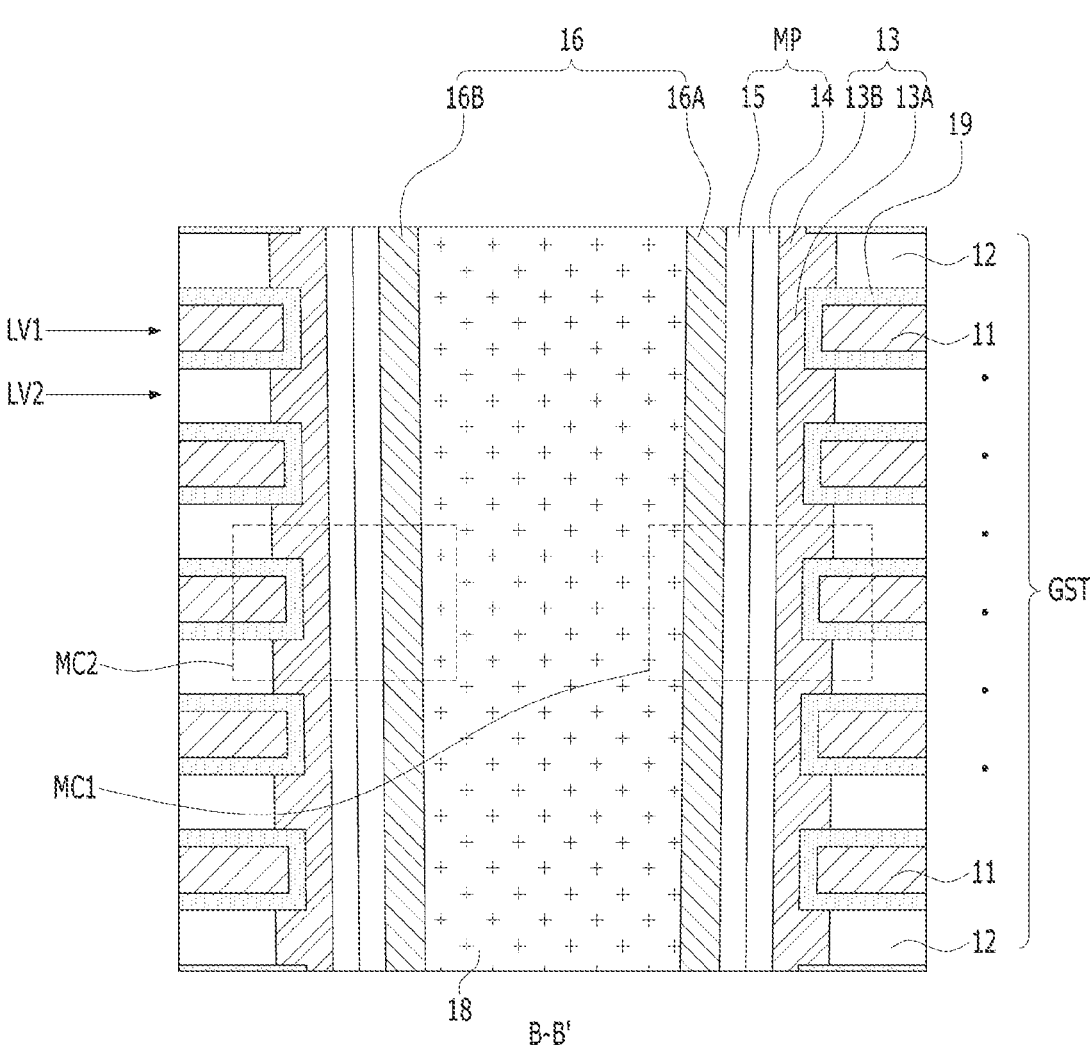
Figure 1D:

FIG. 1A to FIG. 1D are views illustrating the structure of a semiconductor device in accordance with an embodiment. FIG. 1A may be a plan view of a first level LV1 and FIG. 1B may be a plan view of a second level LV2. FIG. 1C may be a cross-sectional view taken along line A-A' in FIG. 1A and FIG. 1D may be a cross-sectional view taken along line B-B' in FIG. 1A.

Referring to FIG. 1A to FIG. 1D, the semiconductor device may include a gate structure GST, an insulating core 18, a first channel pattern 16A, and a second channel pattern 16B. The semiconductor device may further include a barrier pattern 13, a memory pattern MP, or a liner 19, or a combination thereof.

The gate structure GST may include conductive layers 11 and insulating layers 12 that are alternately stacked. The conductive layers 11 may be gate lines such as word lines, bit lines, and select lines. The conductive layers 11 may each include a conductive material such as polysilicon or metal, and the metal may include tungsten (W) or molybdenum (Mo) or a combination thereof. The insulating layers 12 are used to insulate stacked gate lines from each other, and they may each include an insulating material such as an oxide, a nitride, or an air gap. The gate structure GST may include a first level LV1 corresponding to the conductive layers 11 and a second level LV2 corresponding to the insulating layers 12.

The insulating core 18 may be located in the gate structure GST. The insulating core 18 may have a first width W1 in a first direction I and a second width W2 in a second direction II intersecting the first direction I. The first width W1 and the second width W2 may be substantially the same as each other or different from each other. The first width W1 may be greater than the second width W2. In a plane defined by the first direction I and the second direction II, the insulating core 18 may have an elliptical shape. The insulating core 18 may have an elliptical shape, and may have a first long axis L1 and a first short axis S1. The first long axis L1 may be parallel to the first direction I and the first short axis S1 may be parallel to the second direction II. In the gate structure GST, the insulating core 18 may extend in a third direction III. The third direction III may be a direction extending from the plane defined by the first direction I and the second direction II, and may be orthogonal to the plane. The third direction III may be a stacking direction of the conductive layers 11.

The first channel pattern 16A and the second channel pattern 16B may be located in the gate structure GST, and may extend in the third direction III. The first channel pattern 16A and the second channel pattern 16B may surround the insulating core 18. The first channel pattern 16A and the second channel pattern 16B may be located to face each other along the first long axis L1. The insulating core 18 may be located between the first channel pattern 16A and the second channel pattern 16B, and the first channel pattern 16A and the second channel pattern 16B may be spaced apart from each other.

The memory pattern MP may surround the insulating core 18, the first channel pattern 16A, and the second channel pattern 16B. The memory pattern MP may include a tunneling layer 15, a data storage layer 14, or a blocking layer, or a combination thereof. The data storage layer 14 may include a floating gate, polysilicon, a charge trap material, a nitride, a variable resistance material, or the like.

The memory pattern MP may have different shapes in the first level LV1 and the second level LV2. The memory pattern MP may include first portions MP1 corresponding to the conductive layers 11 and second portions MP2 corresponding to the insulating layers 12. The memory pattern MP may include the first portions MP1 and the second portions MP2 alternately arranged along the third direction III.

The first portion MP1 may surround the first channel pattern 16A and the second channel pattern 16B, and the insulating core 18 may be exposed between the first channel pattern 16A and the second channel pattern 16B by the first portion MP1. The first portion MP1 may surround the first long axis L1 of the insulating core 18 and might not surround the first short axis S1 thereof. The second portion MP2 may surround the first channel pattern 16A, the second channel pattern 16B, and the insulating core 18. The second portion MP2 may surround the first long axis L1 and the first short axis S1 of the insulating core 18.

The barrier pattern 13 may be located in the gate structure GST, and may surround the first channel pattern 16A and the second channel pattern 16B. The barrier pattern 13 may be used as an etching barrier for separating a channel layer into the first channel pattern 16A and the second channel pattern 16B during a manufacturing process. The barrier pattern 13 may include a material having an etching selectivity with respect to the first channel pattern 16A and the second channel pattern 16B. As an example, the first channel pattern 16A and the second channel pattern 16B may each include polysilicon, and the barrier pattern 13 may include an oxide.

The barrier pattern 13 may surround the memory pattern MP, and may have a shape similar to that of the memory pattern MP. The barrier pattern 13 may have different shapes in the first level LV1 and the second level LV2. The barrier pattern 13 may include first portions 13A corresponding to the conductive layers 11 and second portions 13B corresponding to the insulating layers 12. The barrier pattern 13 may include the first portions 13A and the second portions 13B alternately arranged along the third direction III.

The first portion 13A may surround the first portion MP1 of the memory pattern MP. The first portion 13A may surround the first channel pattern 16A and the second channel pattern 16B, and the insulating core 18 may be exposed between the first channel pattern 16A and the second channel pattern 16B by the first portion 13A. The first portion 13A may surround the first long axis L1 of the insulating core 18, and might not surround the first short axis S1 thereof. The second portion 13B may surround the second portion MP2 of the memory pattern MP. The second portion 13B may surround the first channel pattern 16A, the second channel pattern 16B, and the insulating core 18. The second portion 13B may surround the first long axis L1 and the first short axis S1 of the insulating core 18.

The barrier pattern 13 may have different thicknesses according to regions. The first portion 13A and the second portion 13B may have substantially the same thickness or different thicknesses. As an example, a region of the barrier pattern 13 corresponding to the first long axis L1 of the insulating core 18 and a region of the barrier pattern 13 corresponding to the first short axis S1 of the insulating core 18 may have different thicknesses. The second portion 13B may have a greater thickness than the first portion 13A at the first long axis L1. The first portion 13A may have a maximum thickness T11 at the first long axis L1, and may decrease in thickness toward the first short axis S1 (T11>T12). The second portion 13B may have a thickness T21 at the first long axis L1 and a thickness T22 at the first short axis S1, which are different from each other, and may have a greater thickness at the first long axis L1 than at the first short axis S1 (T21>T22).

The conductive layer 11 may include a protrusion 11_P protruding toward the insulating core 18 by passing through the barrier pattern 13 and the memory pattern MP between the first channel pattern 16A and the second channel pattern 16B. The protrusion 11_P may pass through the first portion 13A of the barrier pattern 13 and the first portion MP1 of the memory pattern MP at the first short axis S1. The liner 19 may surround the protrusion 11_P and may extend between the barrier pattern 13 and the conductive layers 11.

The liner 19 may be located between the first channel pattern 16A and the second channel pattern 16B, and may surround the insulating core 18. The liner 19 may be used as a gate insulating layer, a blocking layer, or the like, and may include an insulating material such as an oxide, a nitride, or a high-k material. The liner 19 may have different shapes in the first level LV1 and the second level LV2. The liner 19 may include first portions 19A corresponding to the conductive layers 11 and second portions 19B corresponding to the insulating layers 12. The liner 19 may include the first portions 19A and the second portions 19B alternately arranged along the third direction III.

The first portion 19A may surround the insulating core 18 and the first portion 13A of the barrier pattern 13. The first portion 19A may surround a sidewall of the insulating core 18 between the first channel pattern 16A and the second channel pattern 16B, and pass through the memory pattern MP and the barrier pattern 13 at the first short axis S1. The first portion 19A may include a protrusion 19A_P protruding between the memory pattern MP and the insulating core 18. A distance between the first channel pattern 16A and the conductive layer 11 and a distance between the second channel pattern 16B and the conductive layer 11 may be secured by the protrusion 19A_P.

The first portion 19A may extend between the memory pattern MP and the conductive layer 11. The first portion 19A may surround an etched surface of the memory pattern MP, and prevent the data storage layer 14 from contacting the conductive layer 11. The first portion 19A may extend between the first portion 13A of the barrier pattern 13 and the conductive layer 11. The first portion 19A may be used as a blocking layer together with the first portion 13A of the barrier pattern 13.

The second portion 19B may be located between the insulating core 18 and the second portion 13B of the barrier pattern 13. The second portion 19B may be located between the insulating core 18 and the memory pattern MP. The second portion MP2 of the memory pattern MP may surround the second portion 19B of the liner 19.

According to the structure described above, first memory cells MC1 may be located in regions where the first channel pattern 16A and the conductive layers 11 intersect each other. Second memory cells MC2 may be located in regions where the second channel pattern 16B and the conductive layers 11 intersect each other. The first memory cell MC1 and the second memory cell MC2 facing each other in the first direction I with the insulating core 18 interposed therebetween may have a symmetrical structure. The first memory cells MC1 sharing the first channel pattern 16A may belong to a first memory string, and the second memory cells MC2 sharing the second channel pattern 16B may belong to the second memory string. The first memory string and the second memory string may be individually driven.

Figure 2:
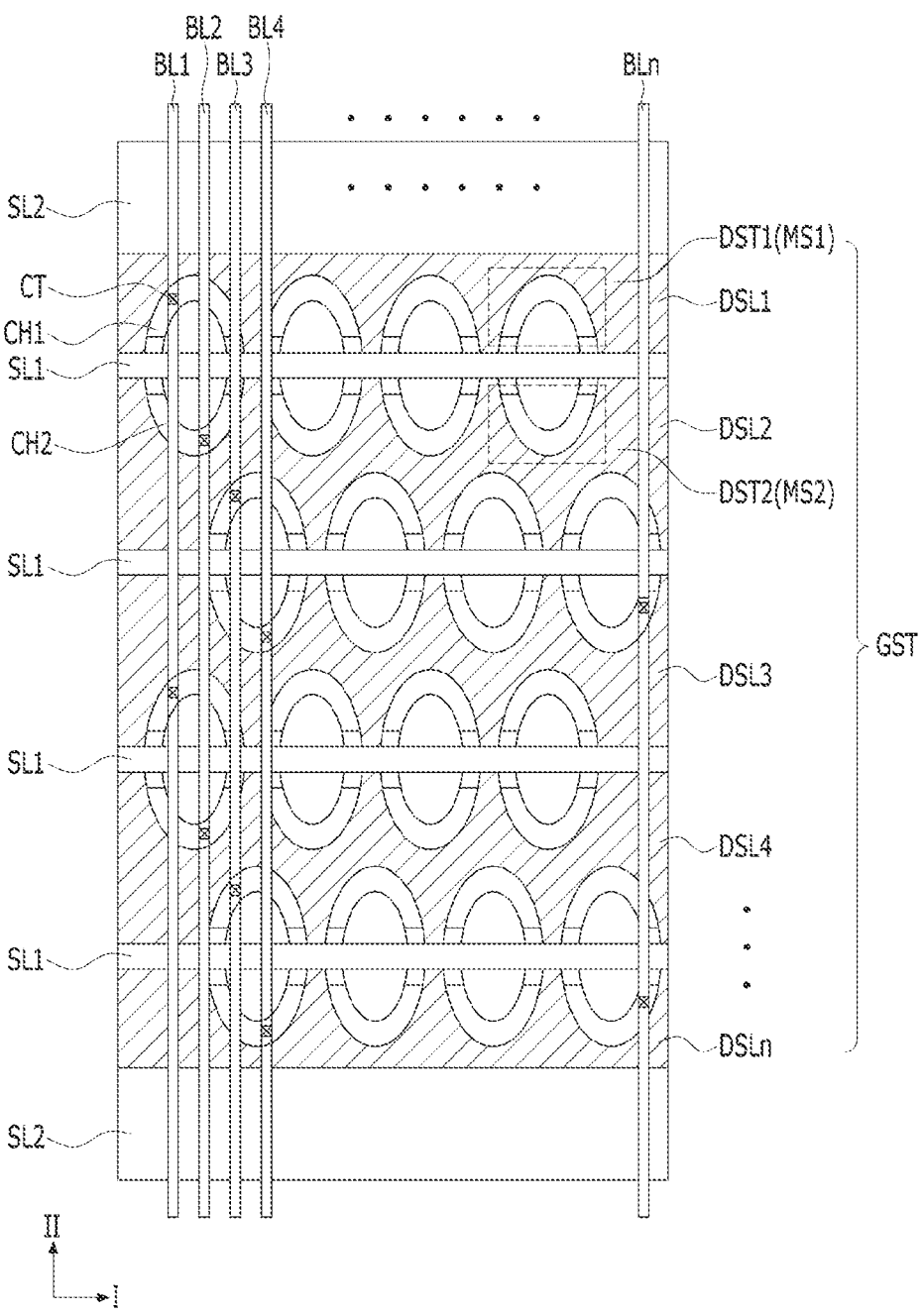
FIG. 2 is a view illustrating the structure of a semiconductor device in accordance with an embodiment.
Figure 3A:
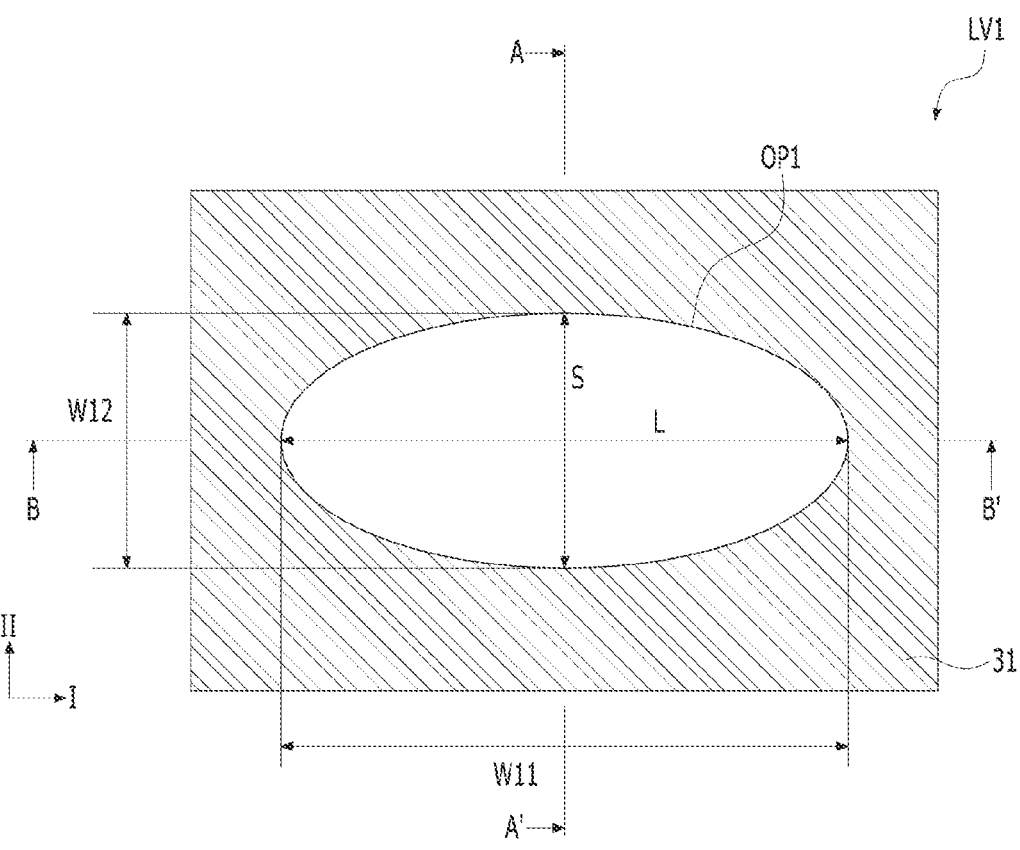
FIG. 3A, 4A, 5A, 6A, 7A, 8A, 9A, and FIG. 10A, FIG. 3B, 4B, 5B, 6B, 7B, 8B, 9B, and FIG. 10B, FIG. 3C, 4C, 5C, 6C, 7C, 8C, 9C, and FIG. 10C, and FIG. 3D, 4D, 5D, 6D, 7D, 8D, 9D, and FIG. 10D are views for describing a manufacturing method of a semiconductor device in accordance with an embodiment.
Figure 3B:
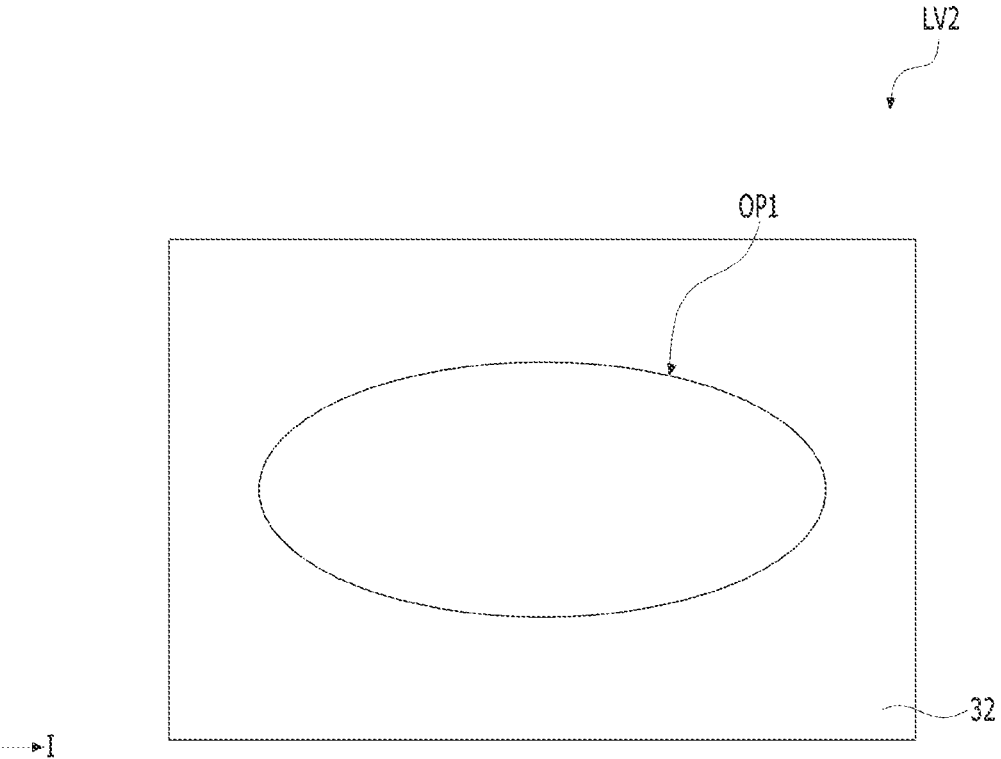
Figure 3C:
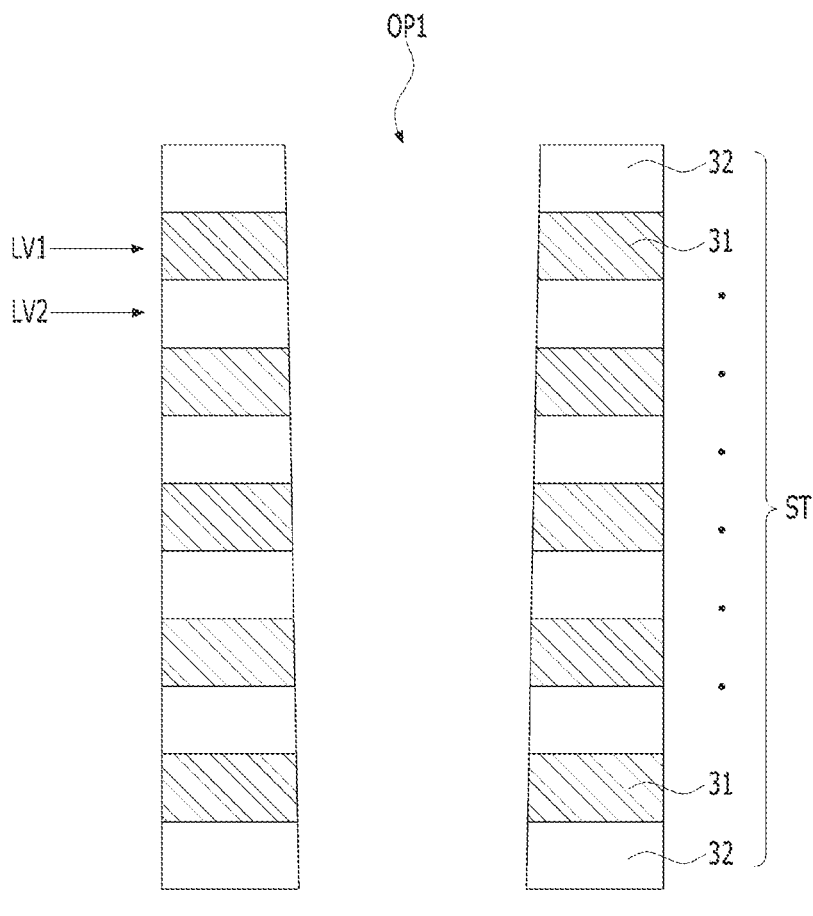
Figure 3C:
Figure 3D:
Figure 3D:
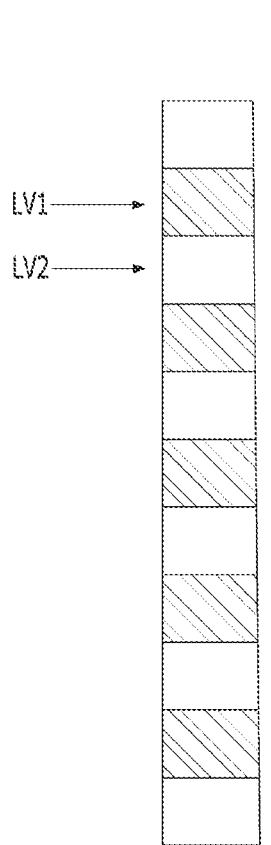
Figure 3D:
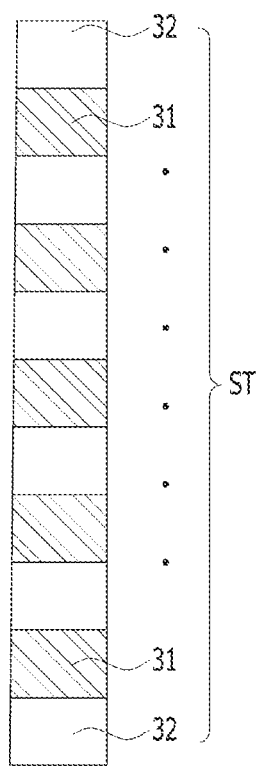
Figure 3D:
Figure 4A:
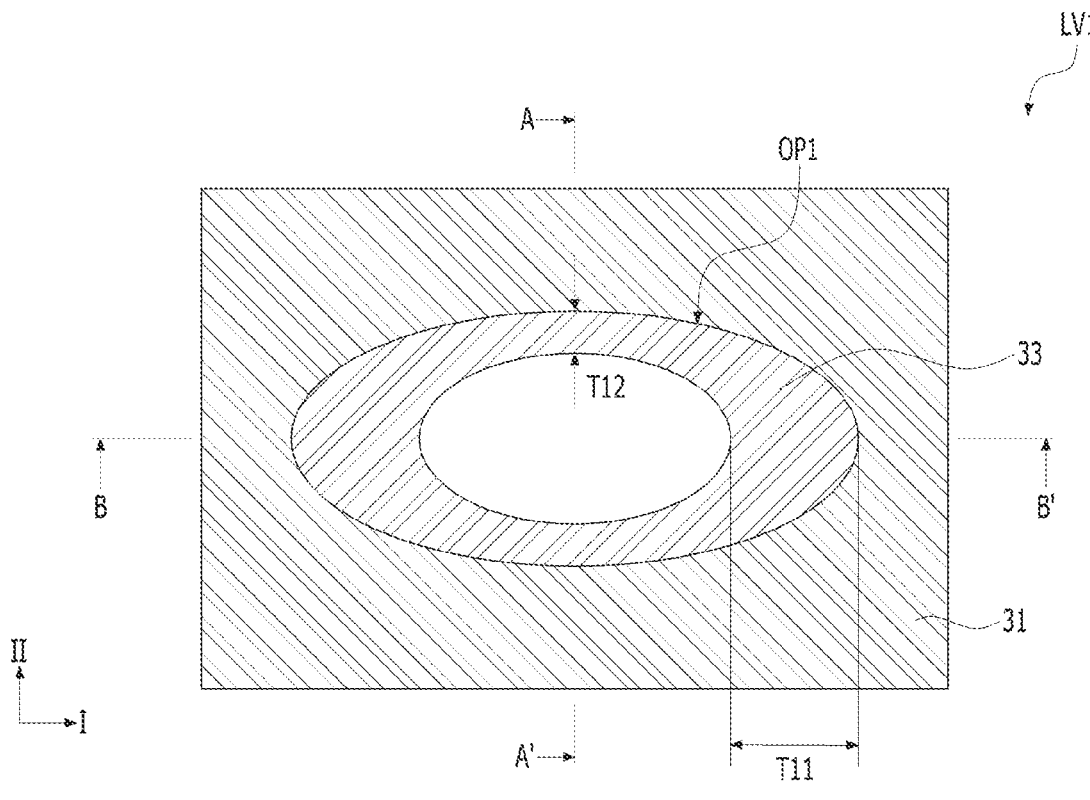
Figure 4B:
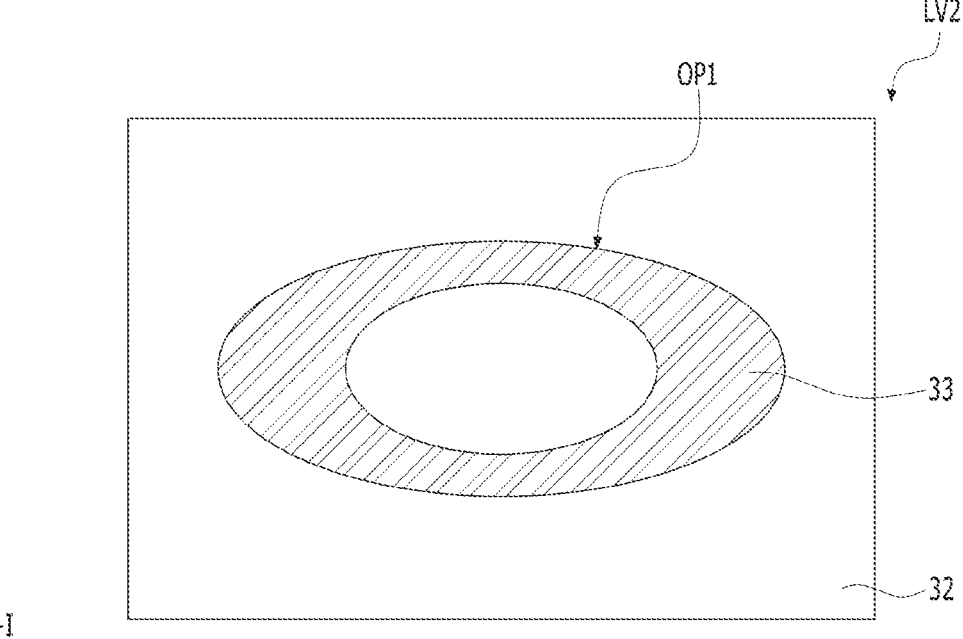
Figure 4C:
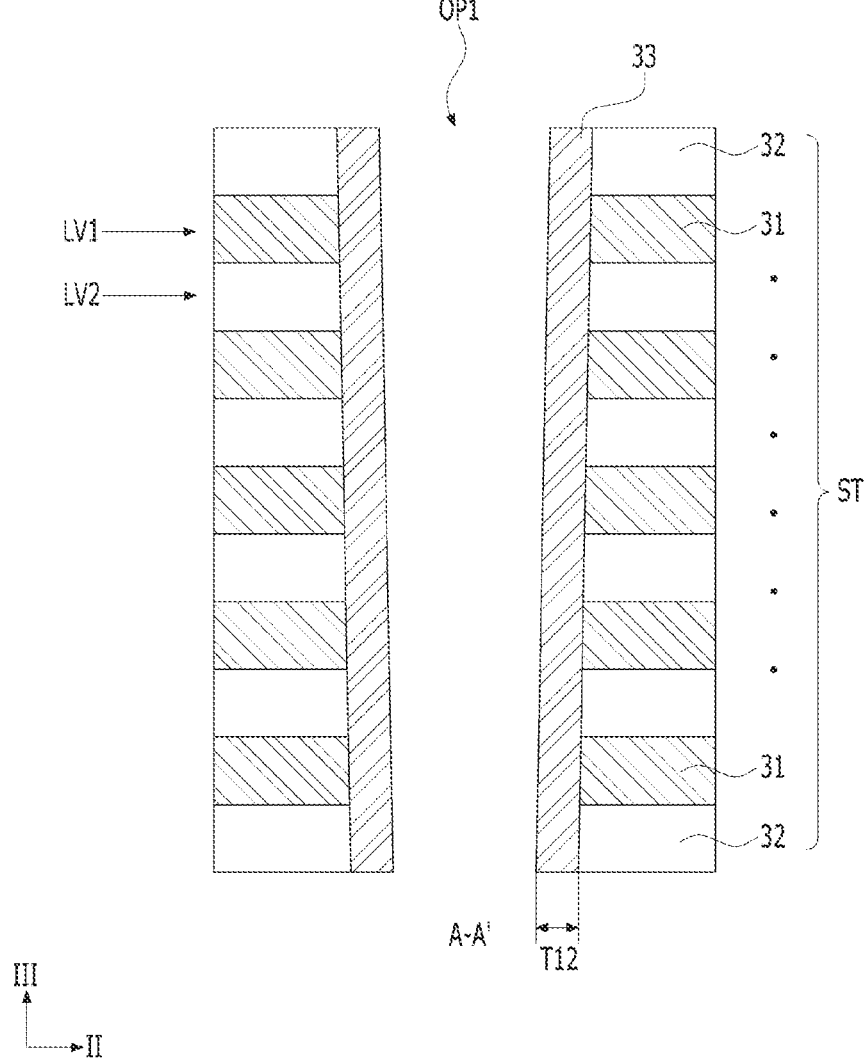
Figure 4D:
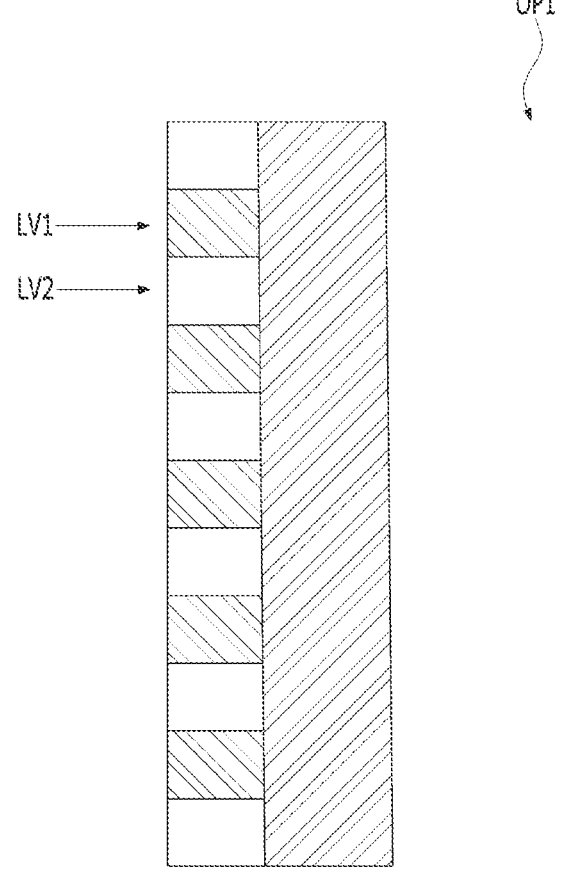
Figure 4D:
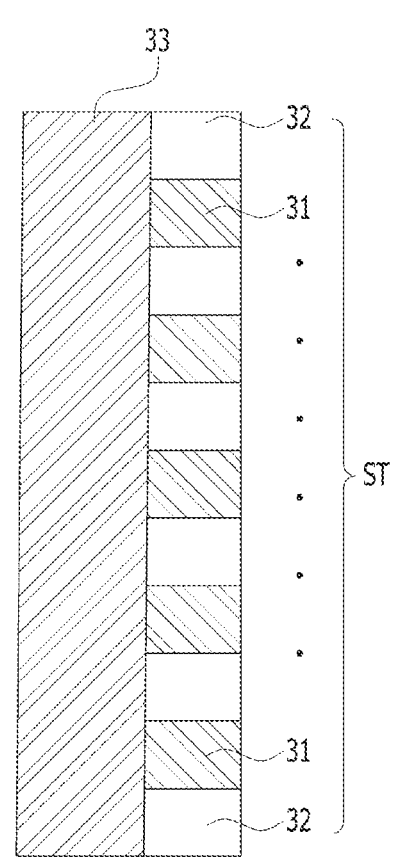
Figure 4D:
Figure 5A:
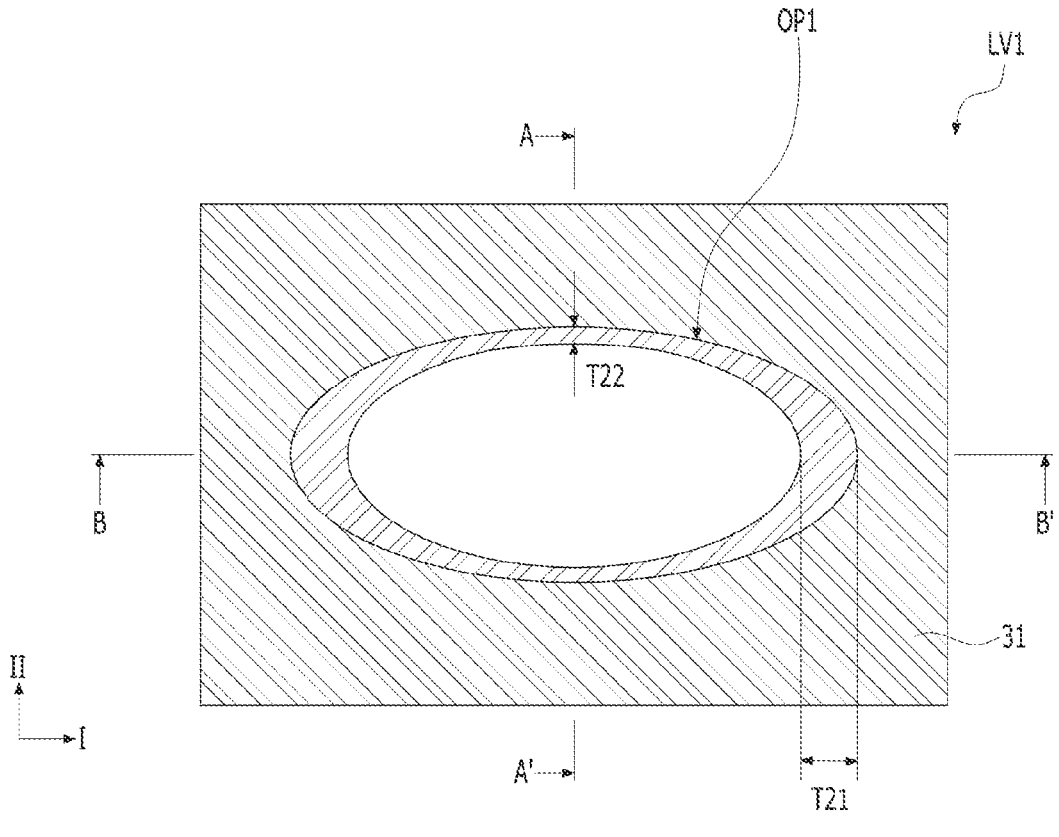
Figure 5B:
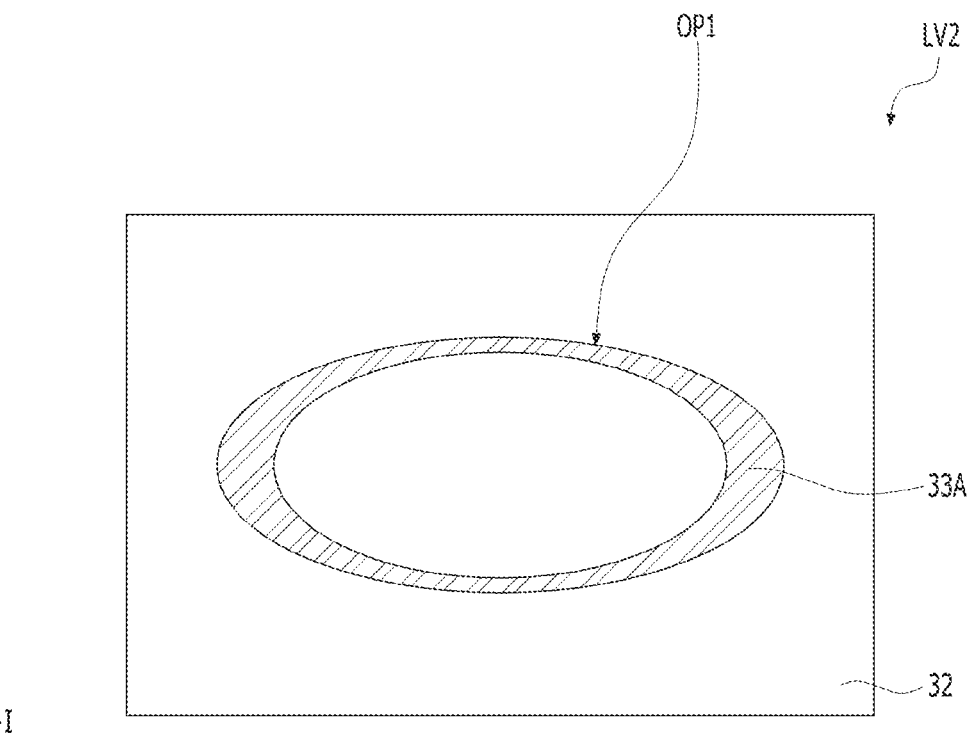
Figure 5C:
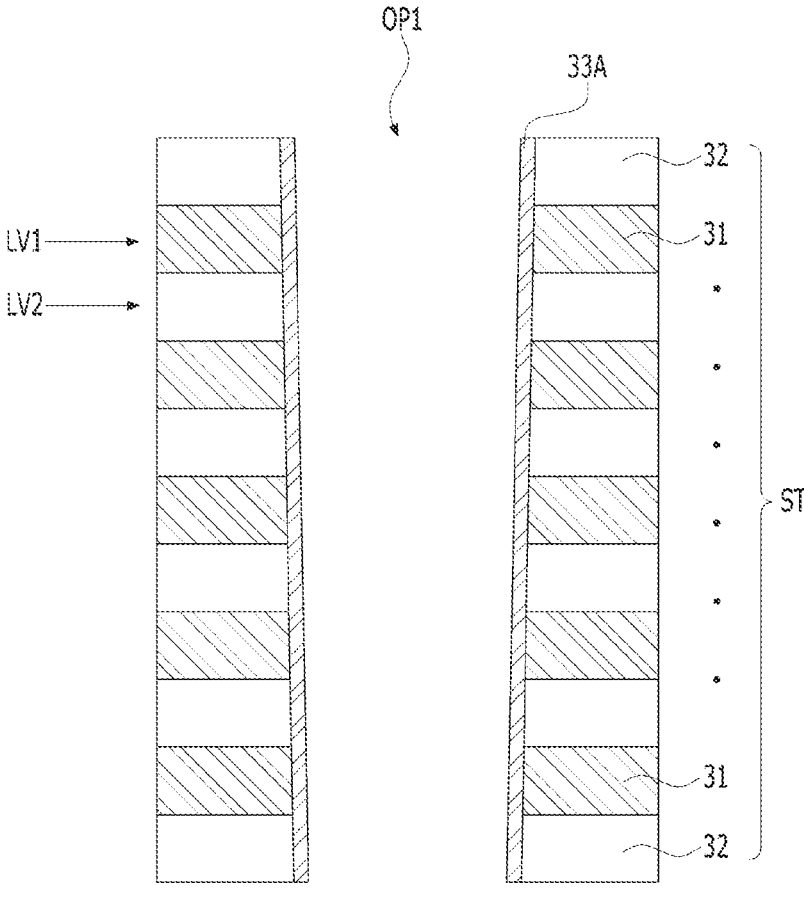
Figure 5C:
Figure 5D:
Figure 5D:
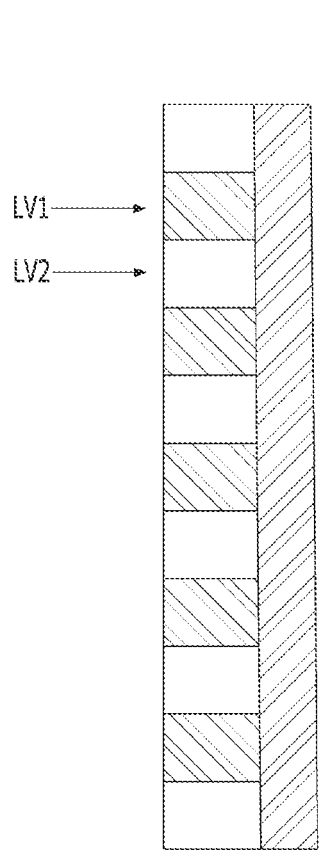
Figure 5D:
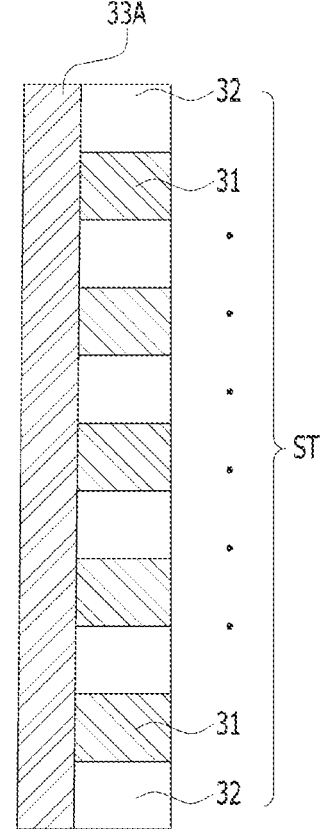
Figure 5D:
Figure 6A:
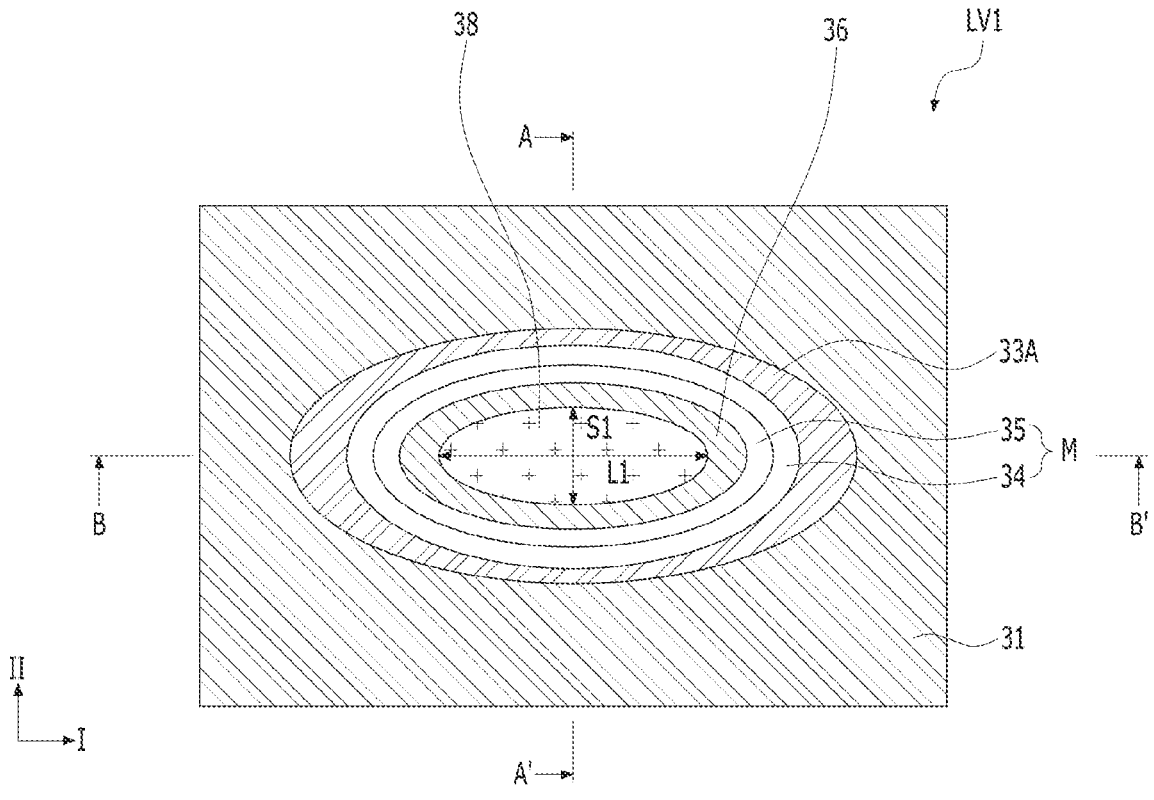
Figure 6B:
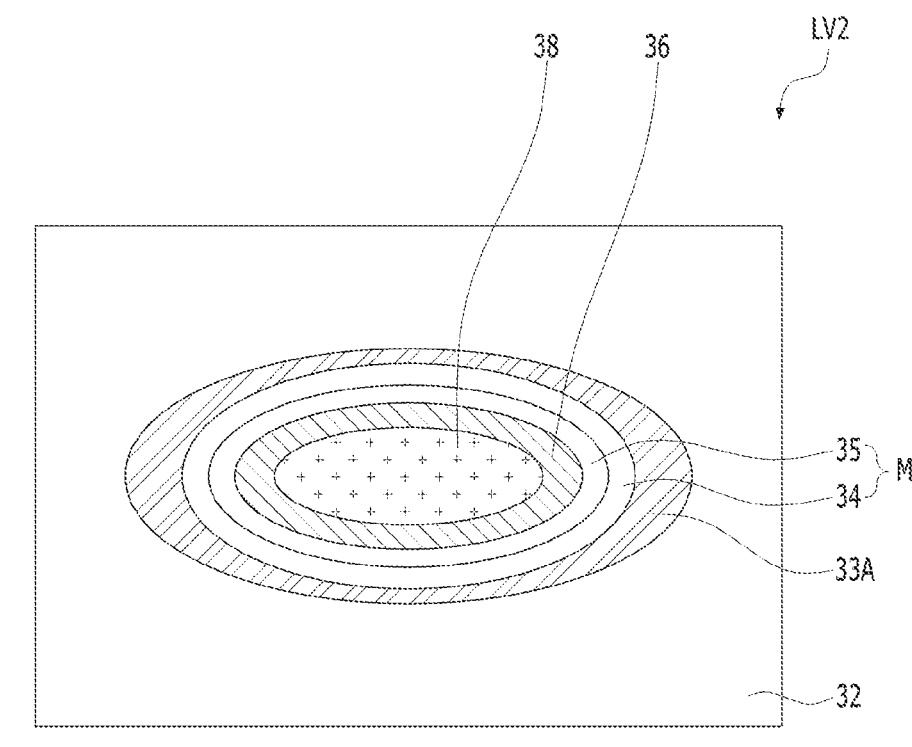
Figure 6C:
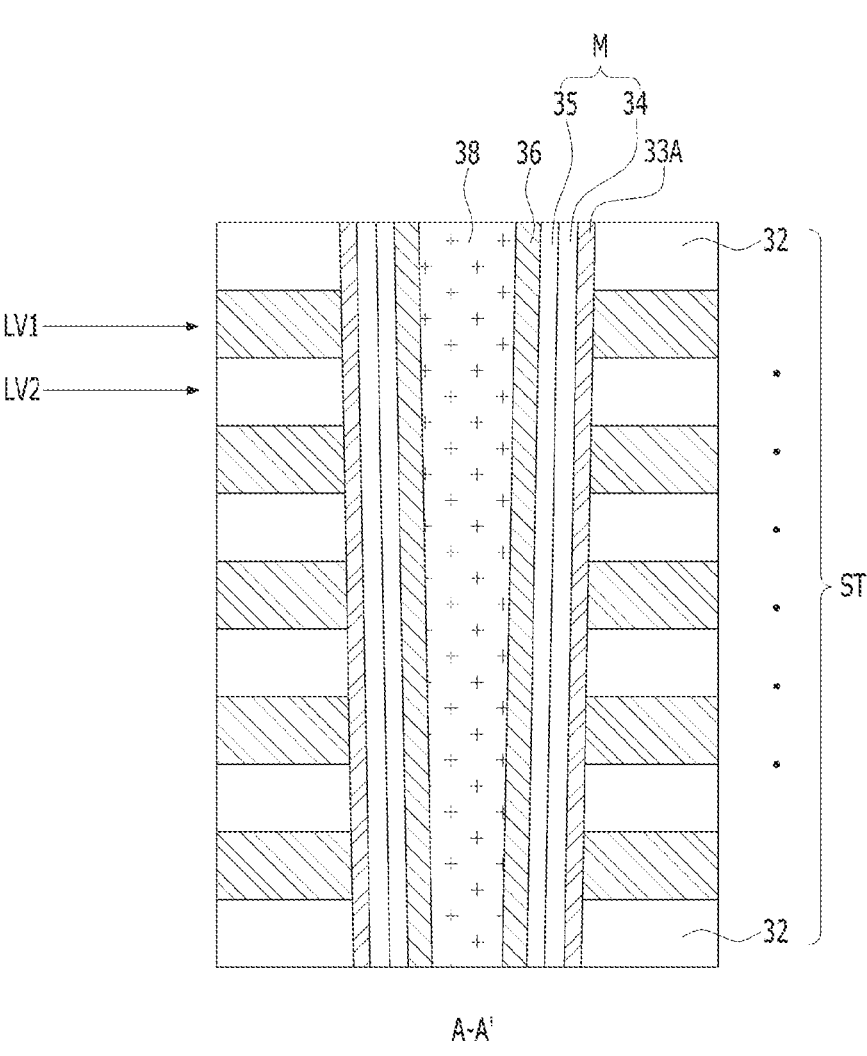
Figure 6C:
Figure 6D:
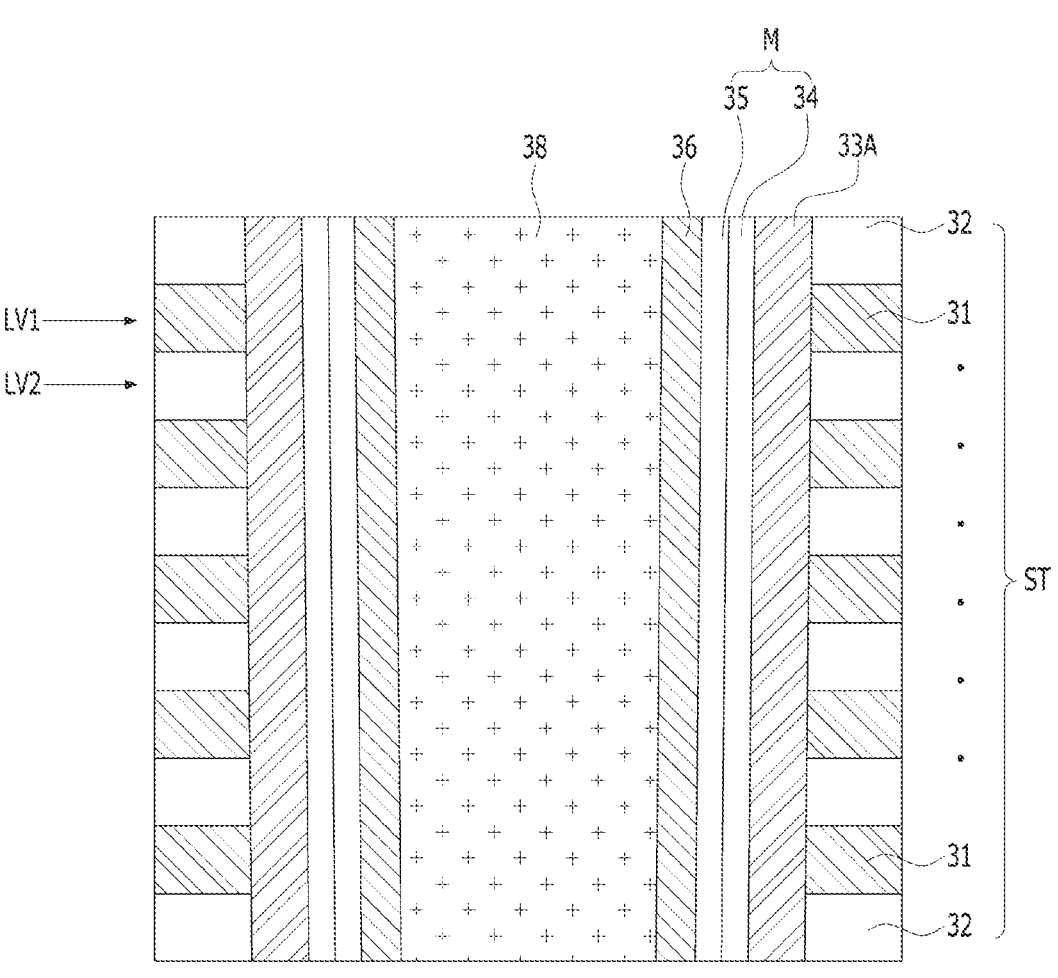
Figure 6D:
Figure 7A:
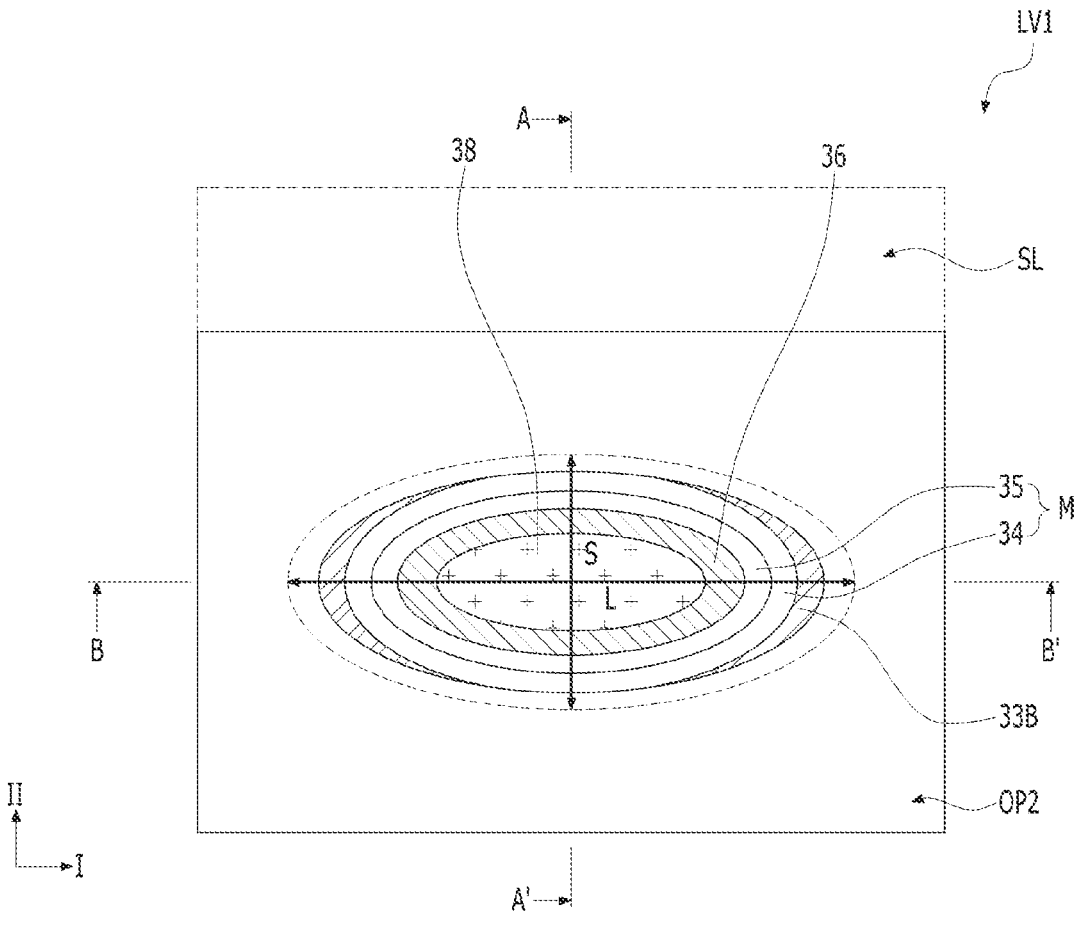
Figure 7B:
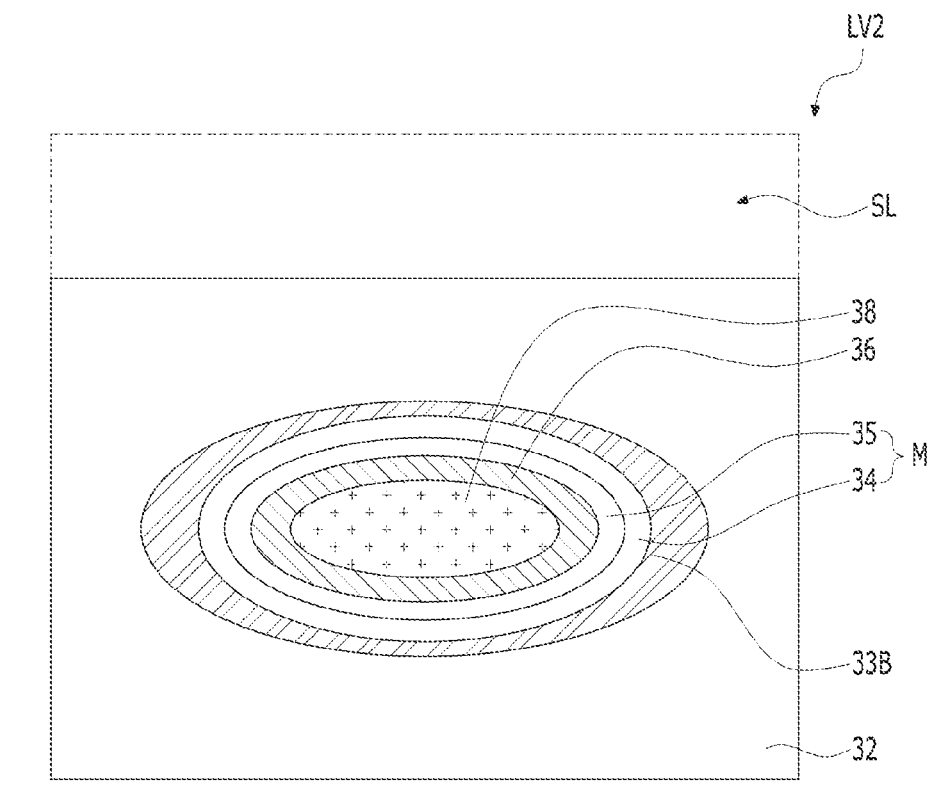
Figure 7C:
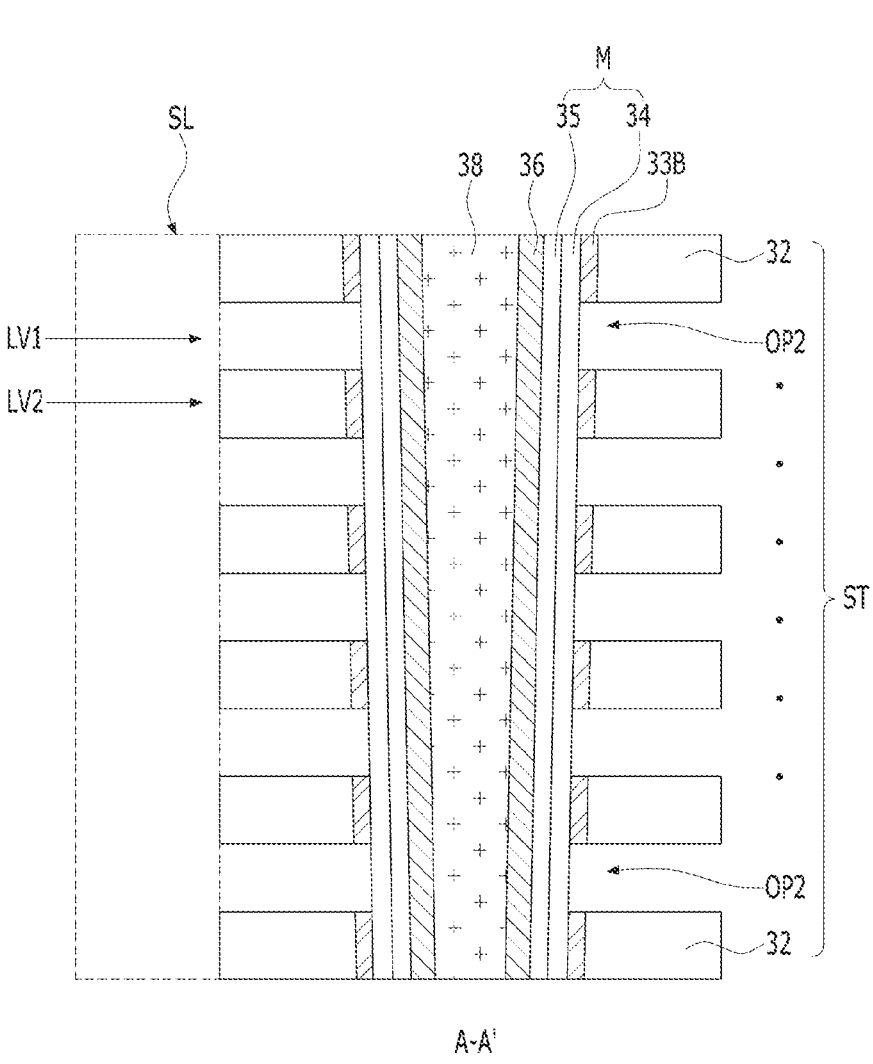
Figure 7C:
Figure 7D:
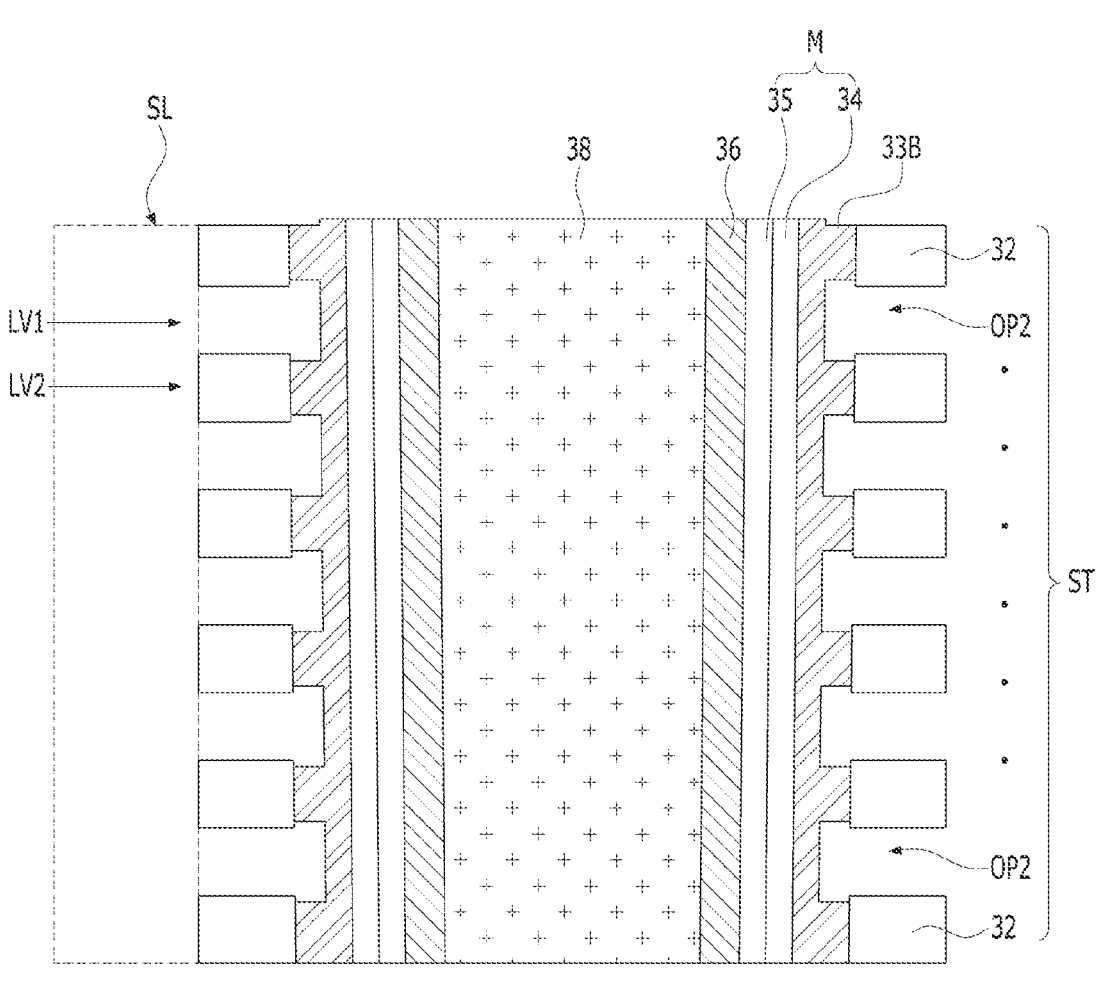
Figure 7D:
Figure 8A:
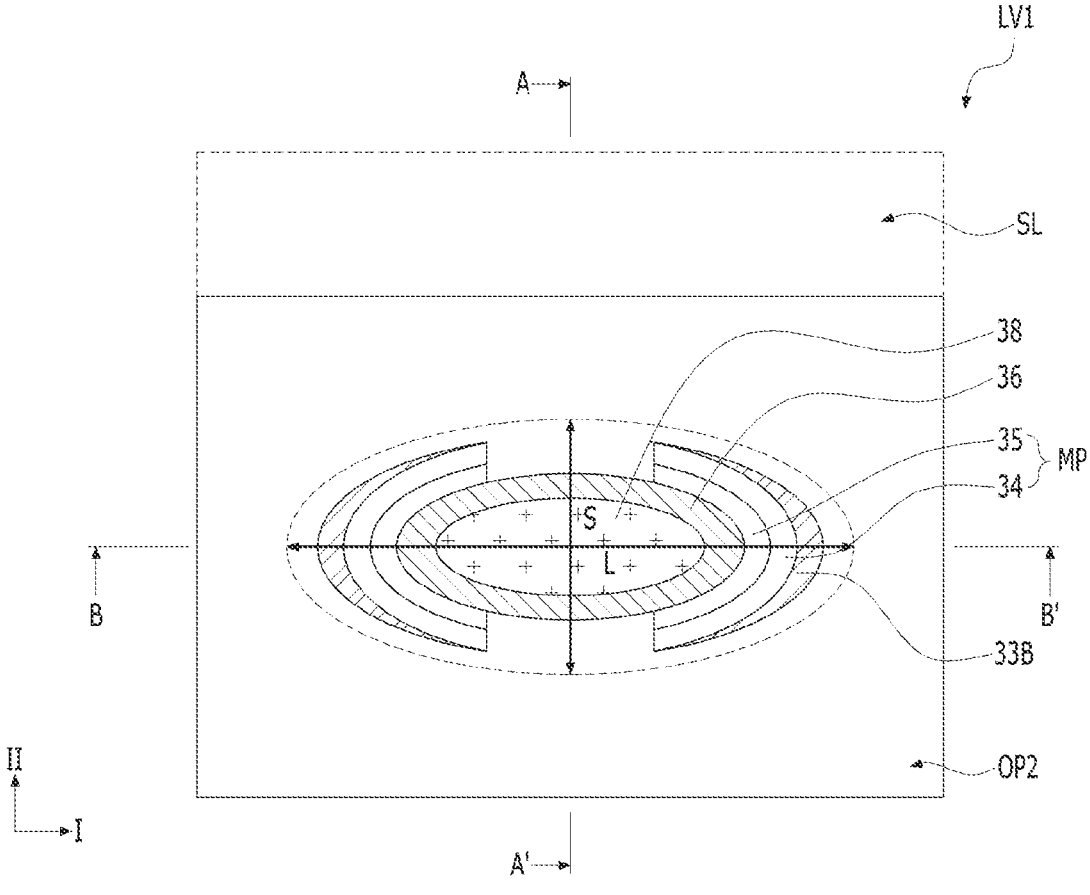
Figure 8B:
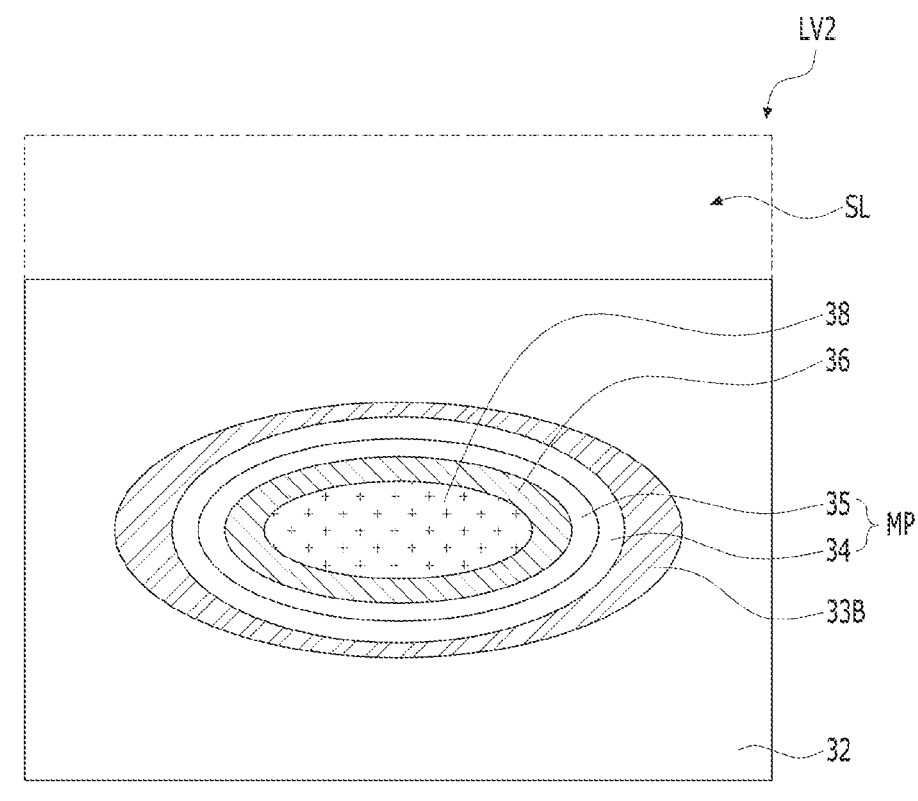
Figure 8C:
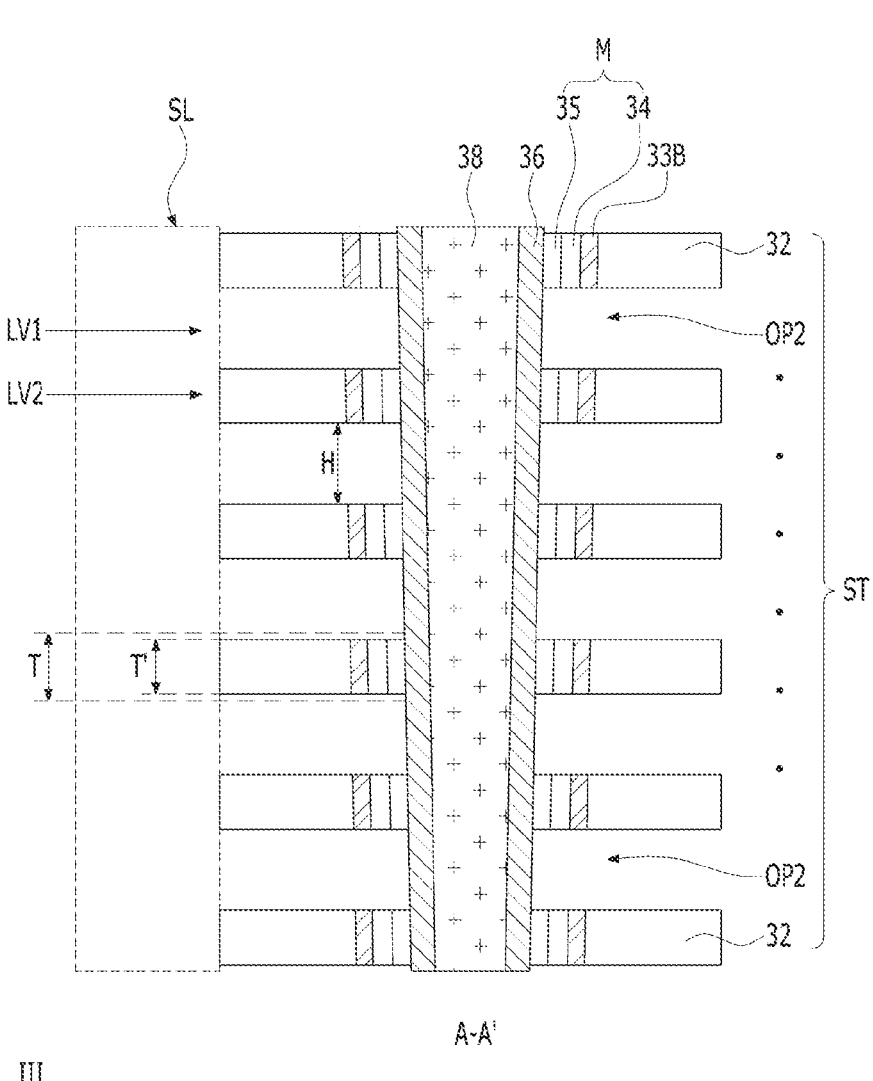
Figure 8C:
Figure 8D:
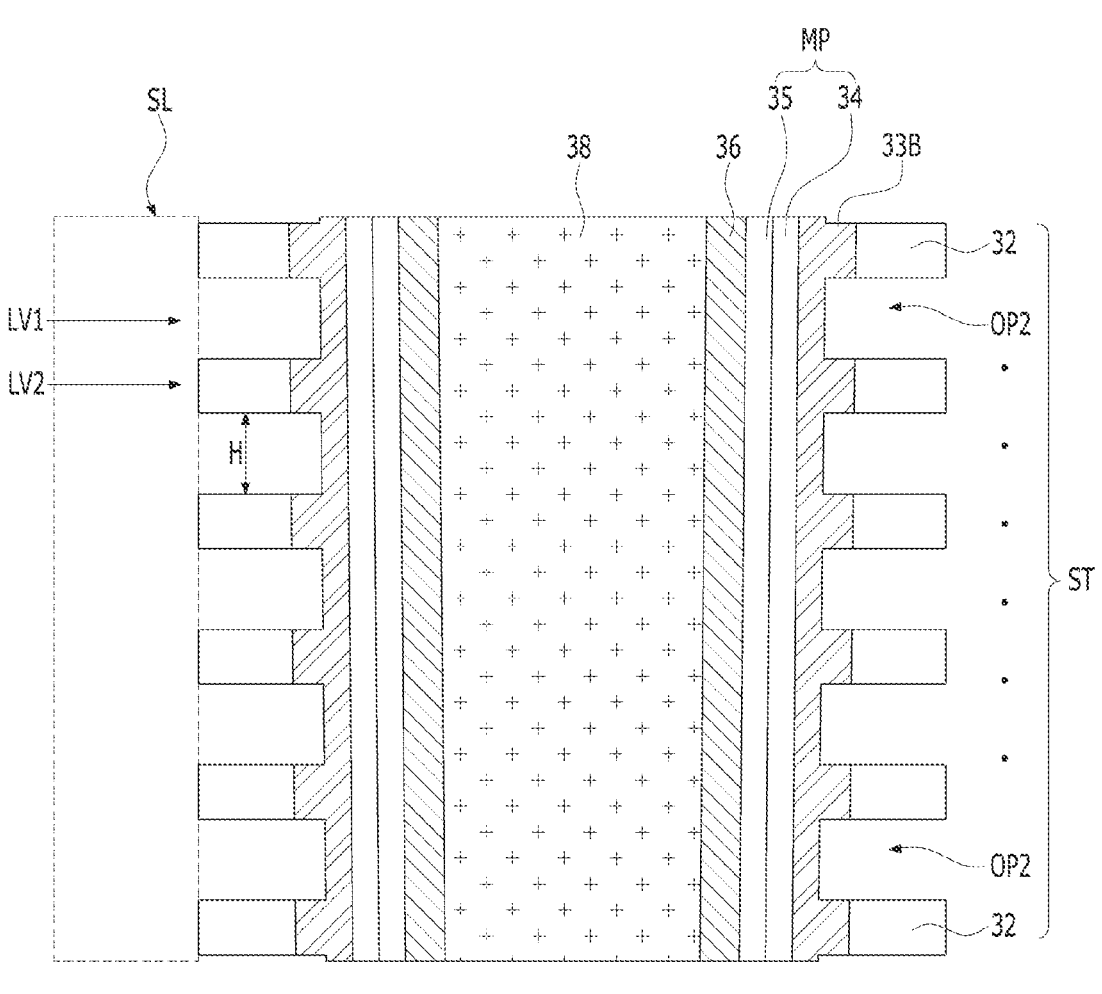
Figure 8D:
Figure 9A:
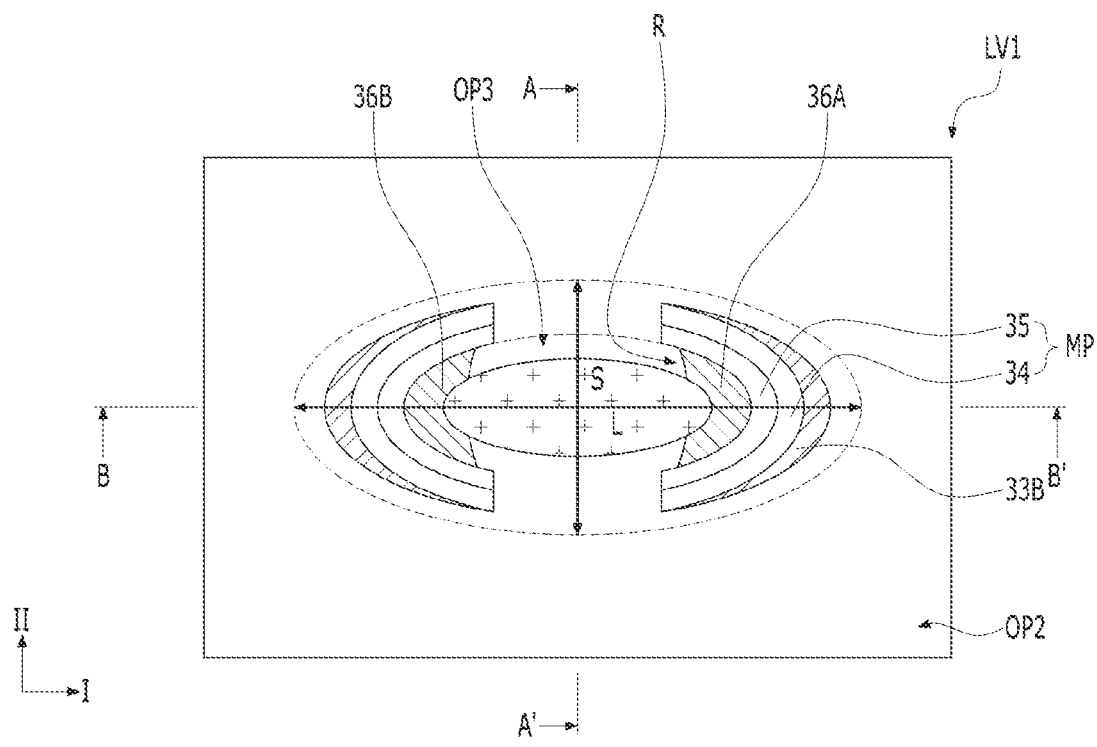
Figure 9B:
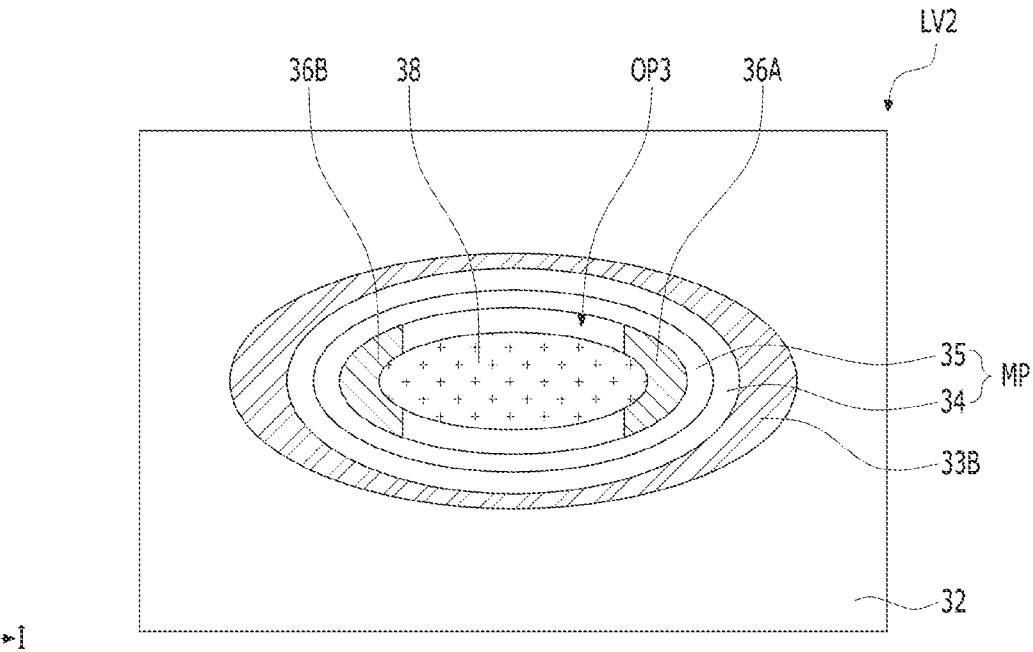
Figure 9C:
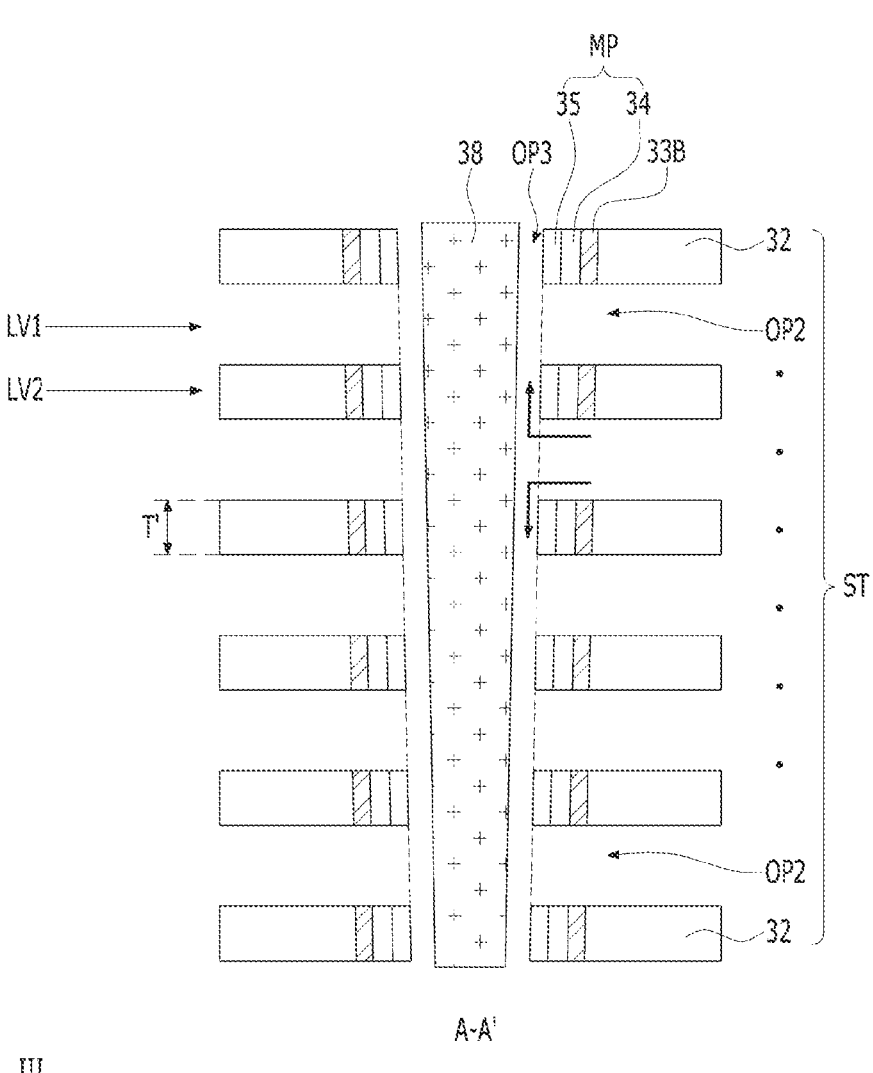
Figure 9C:
Figure 9D:
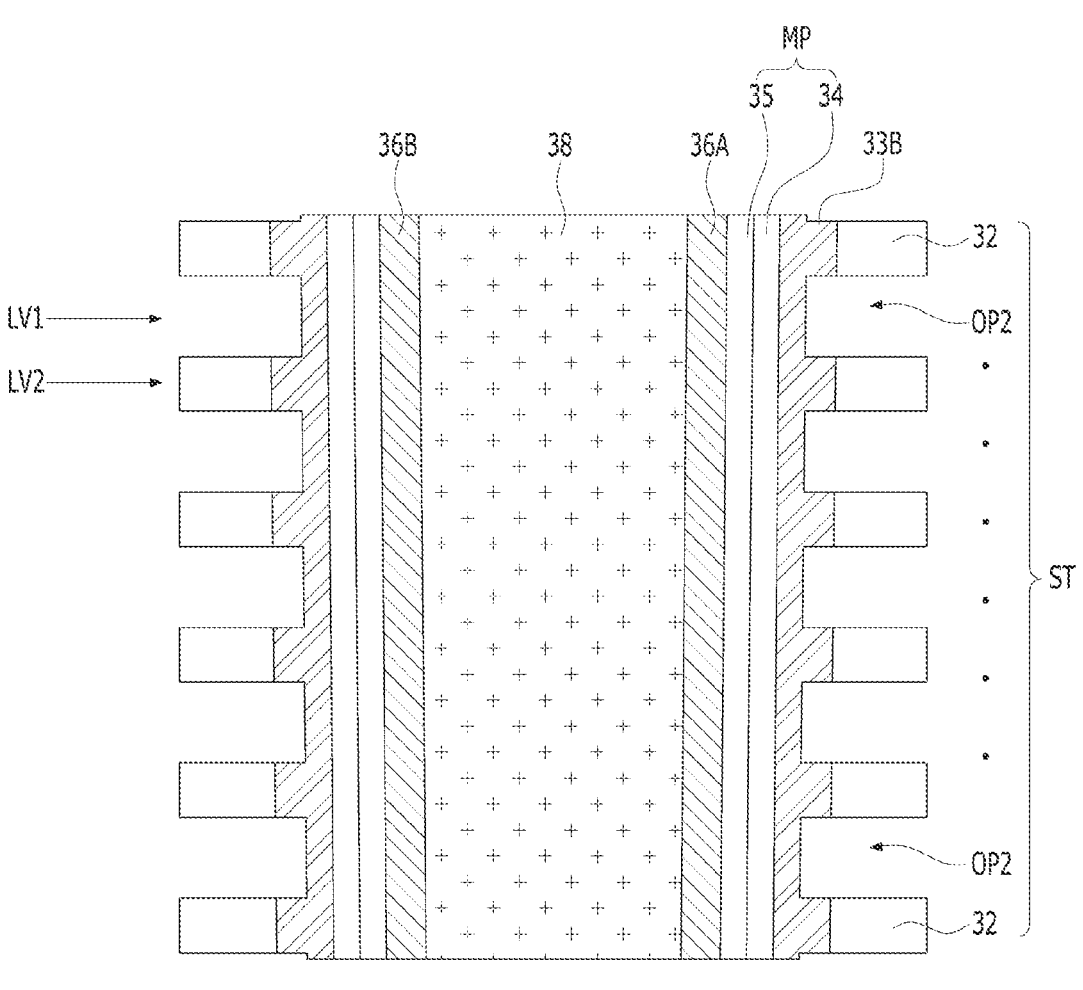
Figure 9D:
Figure 10A:
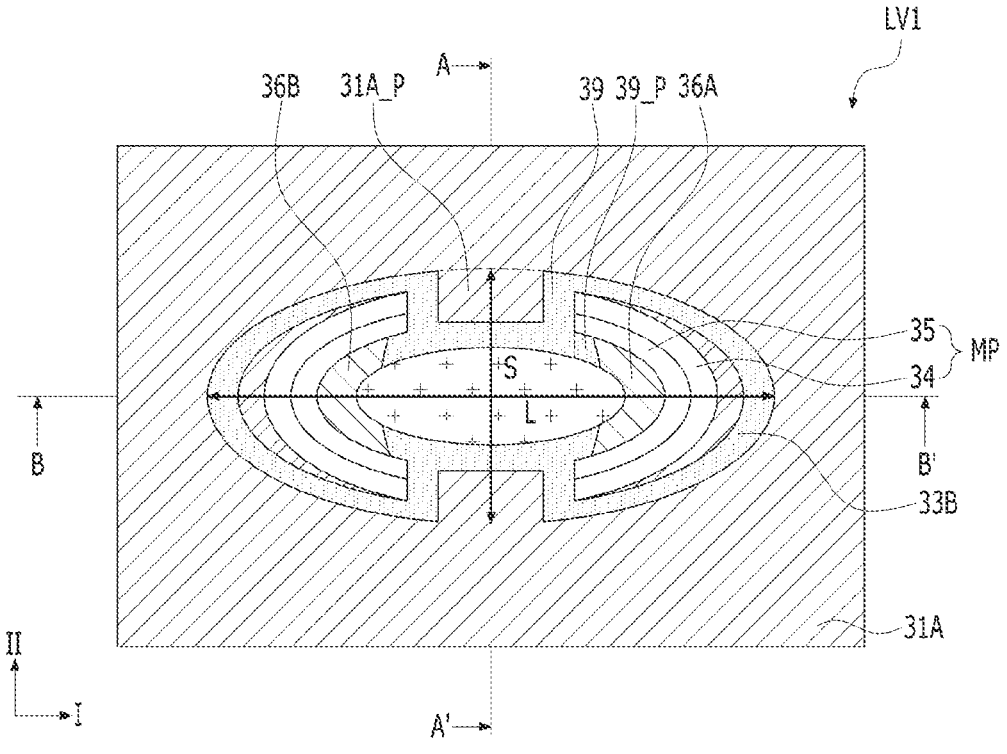
Figure 10B:
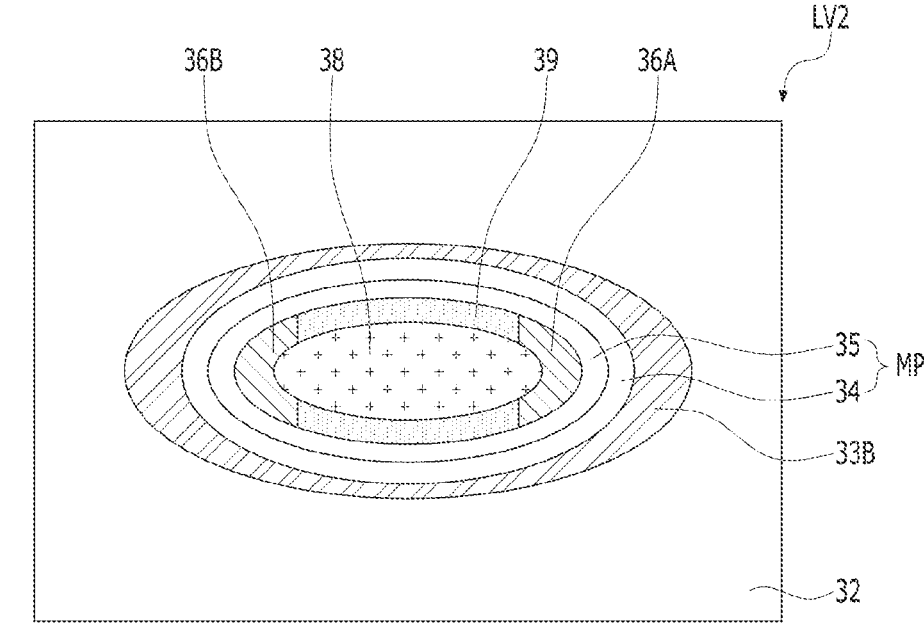
Figure 10C:
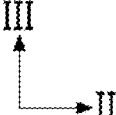
Figure 10D:
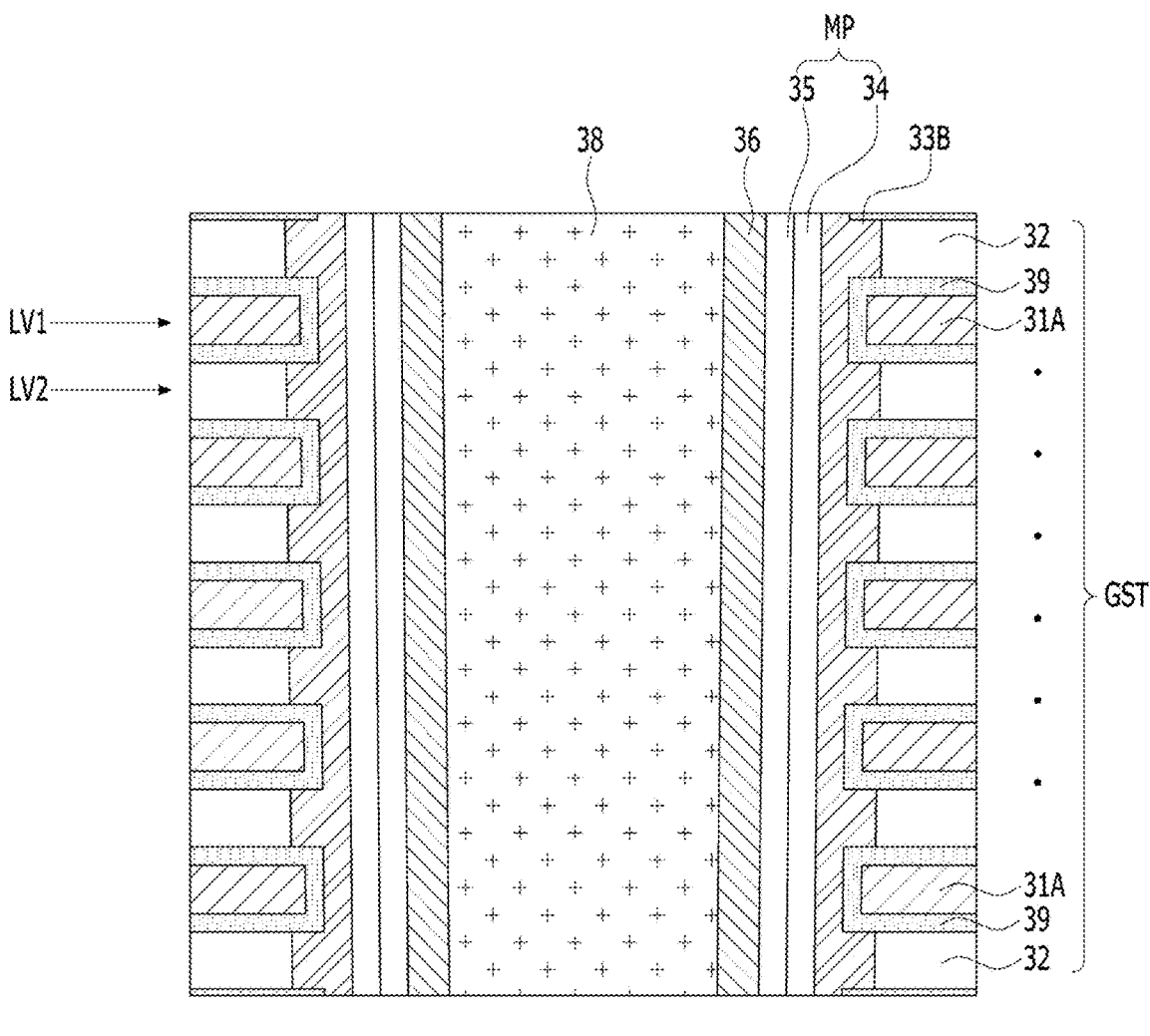
Figure 10D:
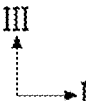

FIG. 2 is a view illustrating the structure of a semiconductor device in accordance with an embodiment. Hereinafter, content overlapping with previously described content will be omitted.

Referring to FIG. 2, the semiconductor device may include a first memory string MS1, a second memory string MS2, bit lines BL1 to BLm, and a contact plug CT. The semiconductor device may further include a gate structure GST, a first channel pattern CH1, a second channel pattern CH2, a first slit structure SL1 or a second slit structure SL2, or a combination thereof.

The gate structure GST may extend in the first direction I. The semiconductor device may include a plurality of gate structures GST arranged in the second direction II. The second slit structure SL2 may be located between the gate structures GST. The second slit structure SL2 may extend in the first direction I, and the gate structures GST may be separated from each other by the second slit structure SL2. The second slit structure SL2 may include a conductive material or an insulating material, or a combination thereof. As an example, the second slit structure SL2 may include a source contact structure, a support, and the like.

The gate structure GST may include conductive layers and insulating layers that are alternately stacked. Among the conductive layers, at least one of uppermost conductive layers may be drain select lines DSL1 to DSLn, at least one of a lowermost conductive layer may be a source select line, and the other conductive layers may be word lines. The gate structure GST may include the first slit structure SL1. The first slit structure SL1 is used for separating the drain select lines DSL1 to DSLn located at the same level from one another and may have a depth different from that of the second slit structure SL2. The first slit structure SL1 may be located in the gate structure GST and pass through the drain select lines DSL1 to DSLn (n may be an integer equal to or greater than 1).

The first channel pattern CH1 and the second channel pattern CH2 may be located in the gate structure GST. At least one first source select transistor, first memory cells, and at least one first drain select transistor DST1 may be stacked along the first channel pattern CH1 to form the first memory string MS1. At least one second source select transistor, second memory cells, and at least one second drain select transistor DST2 may be stacked along the second channel pattern CH2 to form the second memory string MS2.

The bit lines BL1 to BLm may extend in the second direction II intersecting the first direction I. The channel patterns CH1 and CH2 may be connected to the bit lines BL1 to BLm through the contact plug CT. The first drain select transistor DST1 may control a connection between the first memory string MS1 and the first bit line BL1. The second drain select transistor DST2 may control a connection between the second memory string MS2 and the second bit line BL2 (m may be an integer equal to or greater than 1).

Although not illustrated in this drawing, a capping layer may be located above the channel patterns CH1 and CH2. The capping layer may include an impurity region, and impurities may be diffused above the channel patterns CH1 and CH2. Alternatively, a contact pad may be located between the channel patterns CH1 and CH2 and the contact plugs CT. The channel patterns CH1 and CH2 may be connected to the contact plug CT through the capping layer or the contact pad. The capping layer or the contact pad may be separated by the first slit structure SL1. As an example, the contact plugs CT may be connected to the separated capping layers, respectively. Alternatively, the contact plugs CT may be connected to the separated contact pads, respectively.

According to the structure described above, the first memory string MS1 and the second memory string MS2 may be located to face each other in the second direction II. The first memory string MS1 and the second memory string MS2 may be connected to the first bit line BL1 and the second bit line BL2, respectively. Furthermore, the first drain select line DSL1 connected to the first memory string MS1 and the second drain select line DSL2 connected to the second memory string MS2 may be separated from each other by the first slit structure SL1. Accordingly, the first memory string MS1 and the second memory string MS2 may be individually driven.

FIG. 3A to FIG. 10A, FIG. 3B to FIG. 10B, FIG. 3C to FIG. 10C, and FIG. 3D to FIG. 10D are views for describing a manufacturing method of a semiconductor device in accordance with an embodiment. FIG. 3A to FIG. 10A are plan views in the first level LV1 and FIG. 3B to FIG. 10B are plan views in the second level LV2. FIG. 3C to FIG. 10C are cross-sectional views taken along lines A-A' of FIG. 3A to FIG. 10A, and FIG. 3D to FIG. 10D are cross-sectional views taken along lines B-B' of FIG. 3A to FIG. 10A.

Referring to FIG. 3A to FIG. 3D, a stack ST may be formed. The stack ST may include first material layers 31 and second material layers 32 that are alternately stacked. The first material layers 31 may be used to form gate electrodes of word lines, select lines, bit lines, and the like, and the second material layers 32 may be used to insulate the stacked gate electrodes from each other. The first material layers 31 may each include a material having a high etching selectivity with respect to the second material layers 32. As an example, the first material layers 31 may each include a sacrificial material such as a nitride, and the second material layers 32 may each include an insulating material such as an oxide or a nitride.

Subsequently, a first opening OP1 may be formed in the stack ST. The first opening OP1 may extend in the third direction III within the stack ST. The first opening OP1 may have a first width W11 in the first direction I and a second width W12 in the second direction II. As an example, the first opening OP1 may have an elliptical shape in a plane defined by the first direction I and the second direction II. The first opening OP1 may include a long axis L in the first direction I and a short axis S in the second direction II.

Referring to FIG. 4A to FIG. 4D, a barrier layer 33 may be formed in the first opening OP1. The barrier layer 33 may be formed using a deposition process. The barrier layer 33 may have different thicknesses according to regions. As an example, the barrier layer 33 may have a first thickness T11 at the long axis L and a second thickness T12 at the short axis S. The first thickness T11 may be greater than the second thickness T12. The difference between the thickness of the barrier layer 33 at the long axis L and the thickness of the barrier layer 33 at the short axis S may be caused by the shape of the first opening OP1. When the barrier layer 33 is deposited along an inner surface of the first opening OP1 having an elliptical shape, the barrier layer 33 may be deposited with a large thickness at the long axis L having a greater curvature than the short axis S.

The barrier layer 33 may include a material having a high etching selectivity with respect to the first material layers 31. As an example, the first material layers 31 may each include a nitride, and the second material layers 32 may each include an oxide.

Referring to FIG. 5A to FIG. 5D, the barrier layer 33 may be partially etched. The barrier layer 33 may be etched using a wet etching process. As an example, a barrier layer having a target thickness may be formed by partially etching a preliminary barrier layer formed in the first opening OP1. Through this, the thickness of the barrier layer 33 may be adjusted. The etched barrier layer 33A may have a smaller thickness than the barrier layer 33. The etched barrier layer 33A may have a first thickness T21 at the long axis L and a second thickness T22 at the short axis S. The first thickness T21 may be greater than the second thickness T22.

When the first opening OP1 has an elliptical shape, an exposed area of the barrier layer 33 at the short axis S may be greater than an exposed area of the barrier layer 33A at the long axis L. Accordingly, an etching amount of the barrier layer 33 at the short axis S may be greater than an etching amount of the barrier layer 33 at the long axis L. Through this, the difference between the thickness of the barrier layer 33A at the short axis S and the thickness of the barrier layer 33A at the long axis L may be increased.

Referring to FIG. 6A to FIG. 6D, a memory layer M may be formed in the barrier layer 33A. The memory layer M may include at least one of a blocking layer, a data storage layer 34, and a tunneling layer 35. The data storage layer 34 may include a floating gate, polysilicon, a charge trap material, a nitride, a variable resistance material, or the like. As an example, the data storage layer 34 may be formed in the barrier layer 33A, and the tunneling layer 35 may be formed in the data storage layer 34.

Subsequently, a channel layer 36 may be formed in the memory layer M. The channel layer 36 may include a semiconductor material such as silicon (Si) or germanium (Ge). Subsequently, an insulating core 38 may be formed in the channel layer 36. In the plan view, the insulating core 38 may have an elliptical shape. The insulating core 38 may include a first long axis L1 in the first direction I and a first short axis S1 in the second direction II. The insulating core 38 may include an insulating material such as an oxide, a nitride, or an air gap.

Referring to FIG. 7A to FIG. 7D, a slit SL may be formed in the stack ST. The first material layers 31 may be exposed through the slit SL. Subsequently, the first material layers 31 may be etched through the slit SL to form second openings OP2. The barrier layer 33A may be exposed through the second openings OP2.

Subsequently, the barrier layer 33A may be etched through the second openings OP1 to form a barrier pattern 33B. The thickness of the barrier layer 33A may be reduced as a whole by the etching process. Because the barrier layer 33A has a greater thickness at the long axis L than at the short axis S, the barrier layer 33A may be partially etched at the long axis L and may be completely etched along the short axis S. The memory layer M may be exposed between the barrier layers 33A at the short axis S. As an example, when the data storage layer 34 includes a nitride and the barrier layer 33A includes an oxide, the data storage layer 34 may be exposed by selectively etching the barrier layer 33A. In the first level LV1, the barrier pattern 33B may cover the memory layer M at the long axis L and expose the memory layer M at the short axis S.

Referring to FIG. 8A to FIG. 8D, the memory layer M may be etched using the barrier pattern 33B as an etching barrier to form a memory pattern MP. As an example, the data storage layer 34 may be etched to expose the tunneling layer 35, and the exposed tunneling layer 35 may be etched to form the memory pattern MP. The channel layer 36 may be partially exposed by the memory pattern MP. The channel layer 36 may be exposed at the short axis S.

When the barrier layer 33A is etched or the memory pattern MP is etched, the second material layers 32 may be etched. The second material layers 32 exposed through the second openings OP2 may be partially etched, so that the thickness of the second material layers 32 may be reduced from T to T'. A height H of the second opening OP2 may be increased.

Referring to FIG. 9A to FIG. 9D, the channel layer 36 may be etched using the barrier pattern 33B as an etching barrier to form a first channel pattern 36A and a second channel pattern 36B. As an example, the channel layer 36 may be selectively etched using a wet etching process. An etching chemical introduced through the second opening OP2 may etch the channel layer 36. Through this, a third opening OP3 may be formed. The third opening OP3 may be located on the short axis S and may extend in the third direction III.

In the first level LV1, a portion of the channel layer 36 covered by the barrier pattern 33B may be protected, and a portion of the channel layer 36 exposed by the barrier pattern 33B may be etched. Through this, the third opening OP3 connected to the second opening OP2 may be formed. At this time, a portion of the channel layer 36 located between the memory pattern MP and the insulating core 38 may be partially etched. In such a case, the third opening OP3 may extend between the memory pattern MP and the insulating core 38. The extended portion is indicated by reference numeral 'R'.

The etching chemical introduced through the second opening OP2 of the first level LV1 may etch the channel layer 36 along the third direction III, and etch the channel layer 36 of the second level LV2. In the second level LV2, the third opening OP3 may be located in the memory pattern MP and may be located between the insulating core 38 and the memory pattern MP.

The channel layer 36 may be separated into the first channel pattern 36A and the second channel pattern 36B by the third opening OP3. The third opening OP3 may be formed by etching a portion of the channel layer 36 corresponding to the short axis S. At this time, the channel layer 36 may be directly exposed through the second opening OP2 in the first level LV1, but the channel layer 36 might not be directly exposed in the second level LV2. Accordingly, etching conditions may be adjusted so that the etching chemical may move along the third direction III to etch the channel layer 36 of the second level LV2. As an example, the channel layer 36 may be etched using a ½ thickness (T'/2) of the second material layer 32 as an etching target.

Through this, the portion of the channel layer 36 corresponding to the short axis S may be selectively etched, and the first channel pattern 36A and the second channel pattern 36B located to face each other along the long axis L may be formed.

Referring to FIG. 10A to FIG. 10D, a liner 39 may be formed in the second opening OP2 and the third opening OP3. The liner 39 may be formed using a deposition process. The liner 39 may include an insulating material such as an oxide or a high-k material. The liner 39 may be a gate insulating layer, a memory layer, or a blocking layer. As an example, the liner 39 may include aluminum oxide.

In the first level LV1, the liner 39 may be formed to surround the barrier pattern 33B, the memory pattern MP, the first channel pattern 36A, the second channel pattern 36B, and the insulating core 38 exposed through the second opening OP2 and the third opening OP3. The liner 39 may be formed along the etched surfaces of the barrier pattern 33B, the memory pattern MP, the first channel pattern 36A, and the second channel pattern 36B. The liner 39 may be formed along a sidewall of the insulating core 38 between the first channel pattern 36A and the second channel pattern 36B. The liner 39 may include a protrusion 39_P extending between the insulating core 38 and the memory pattern MP.

In the second level LV2, the liner 39 may be formed to surround the memory pattern MP, the first channel pattern 36A, the second channel pattern 36B, and the insulating core 38 exposed through the third opening OP3. The third opening OP3 may be filled with the liner 39.

Subsequently, third material layers 31A may be formed in the second openings OP2, respectively. The third material layers 31A may each include metal such as titanium (Ti), tantalum (Ta), tungsten (W), or molybdenum (Mo). As an example, a metal layer may be formed after barrier metal is formed in the second openings OP2. Through this, a gate structure GST including the second material layers 32 and the third material layers 31A that are alternately stacked may be formed.

The third material layer 31A may include a protrusion 31A_P protruding between the first channel pattern 36A and the second channel pattern 36B. The protrusion 31A_P may be located on the short axis S, and may protrude toward the insulating core 38 through the barrier pattern 33B and the memory pattern MP. The protrusion 31A_P may be surrounded by the liner 39. The third material layer 31A and the memory pattern MP may be separated by the liner 39, and the liner 39 may be used as a blocking layer. The third material layer 31A and the first channel pattern 36A/the second channel pattern 36B may be separated by the liner 39, and the liner 39 may be used as a gate insulating layer.

According to the manufacturing method described above, the barrier pattern 33B may be formed by using the difference in the thickness of the barrier layer 33A according to regions, and the channel layer 36 may be separated into the first channel pattern 36A and the second channel pattern 36B by using the barrier pattern 33B. Through this, the mutually separated first channel pattern 36A and second channel pattern 36B may be formed in the first opening OP1. The first channel pattern 36A may belong to a first memory string, and the second channel pattern 36B may belong to a second memory string. Consequently, at least two memory strings can be formed in the first opening OP1 and the degree of integration of a semiconductor device can be improved.

Although some embodiments according to the technical idea of the present disclosure have been described above with reference to the accompanying drawings, this is only for explaining the embodiments according to the concept of the present disclosure, and the present disclosure is not limited to the above embodiments. Various types of substitutions, modifications, and/or changes for the embodiments may be made by those skilled in the art, to which the present disclosure pertains, without departing from the technical idea of the present disclosure defined in the following claims, and it should be construed that these substitutions, modifications, and/or changes belong to the scope of the present disclosure.

What is claimed is:

1. A semiconductor device comprising:
a gate structure including conductive layers and insulating layers that are alternately stacked;
an insulating core located in the gate structure, the insulating core including a long axis and a short axis;
a first channel pattern and a second channel pattern surrounding the insulating core and located to face each other along the long axis; and
a barrier pattern surrounding the first channel pattern and the second channel pattern, the barrier pattern having different thicknesses at the long axis and the short axis.

2. The semiconductor device of claim 1, wherein each of the conductive layers includes a protrusion protruding toward the insulating core by passing through the barrier pattern between the first channel pattern and the second channel pattern.

3. The semiconductor device of claim 2, further comprising:
a liner surrounding the protrusion and extending between the barrier pattern and the conductive layers.

4. The semiconductor device of claim 1, wherein the barrier pattern includes first portions corresponding to the conductive layers and second portions corresponding to the insulating layers, and each of the second portions has a greater thickness at the long axis than at the short axis.

5. The semiconductor device of claim 4, wherein the second portions each have a greater thickness than the first portions.

6. The semiconductor device of claim 1, further comprising:
a memory pattern surrounding the first channel pattern and the second channel pattern, the memory pattern located between the first channel pattern and the barrier pattern and located between the second channel pattern and the barrier pattern.

7. The semiconductor device of claim 6, further comprising:
a liner surrounding the insulating core between the first channel pattern and the second channel pattern.

8. The semiconductor device of claim 7, wherein the memory pattern includes first portions corresponding to the conductive layers and second portions corresponding to the insulating layers, wherein the liner passes through the first portions, and wherein the second portions surround the liner.

9. The semiconductor device of claim 1, further comprising:

a liner surrounding the insulating core between the first channel pattern and the second channel pattern, the liner including first portions corresponding to the conductive layers and second portions corresponding to the insulating layers.

10. The semiconductor device of claim 9, wherein the first portions of the liner extend between the barrier pattern and the conductive layers.

11. The semiconductor device of claim 9, wherein the first portions of the liner surround the first channel pattern, the second channel pattern, and the barrier pattern.

12. The semiconductor device of claim 9, wherein the second portions of the liner are located between the insulating core and the barrier pattern.

13. The semiconductor device of claim 1, wherein the first channel pattern and the second channel pattern are separated from each other.

14. A semiconductor device comprising:

a gate structure including conductive layers and insulating layers that are alternately stacked;

a first channel pattern and a second channel pattern located in the gate structure;

an insulating core located between the first channel pattern and the second channel pattern;

a memory pattern surrounding the first channel pattern, the second channel pattern, and the insulating core; and a barrier pattern surrounding the memory pattern, wherein each of the conductive layers includes a protrusion protruding toward the insulating core through the barrier pattern and the memory pattern.

15. The semiconductor device of claim 14, further comprising:

a liner surrounding the insulating core between the first channel pattern and the second channel pattern.

16. The semiconductor device of claim 15, wherein the liner surrounds the protrusion and extends between the barrier pattern and the conductive layers.

17. The semiconductor device of claim 15, wherein the liner includes first portions corresponding to the conductive layers and second portions corresponding to the insulating layers, and wherein the second portion is located between the insulating core and the memory pattern.

* * * * *